(12) United States Patent
Blaettler et al.

(10) Patent No.: US 10,128,871 B2
(45) Date of Patent: Nov. 13, 2018

(54) DIAGONAL ANTI-DIAGONAL MEMORY STRUCTURE

(71) Applicant: INTERNATIONAL BUSINESS MACHINES CORPORATION, Armonk, NY (US)

(72) Inventors: Tobias Blaettler, Maur (CH); Charles J. Camp, Sugar Land, TX (US); Thomas Mittelholzer, Zurich (CH); Nikolaos Papandreou, Thalwil (CH); Thomas Parnell, Zurich (CH); Charalampos Pozidis, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 15/440,943

(22) Filed: Feb. 23, 2017

(65) Prior Publication Data

US 2017/0163292 A1    Jun. 8, 2017

Related U.S. Application Data

(63) Continuation of application No. 14/583,738, filed on Dec. 28, 2014, now Pat. No. 9,647,694.

(51) Int. Cl.
  *G06F 3/06* (2006.01)
  *H03M 13/29* (2006.01)
  *H03M 13/00* (2006.01)

(52) U.S. Cl.
  CPC ...... *H03M 13/2921* (2013.01); *G06F 3/0613* (2013.01); *G06F 3/0619* (2013.01);
  (Continued)

(58) Field of Classification Search
  CPC . G11C 16/0483; G11C 16/10; G11C 11/1657; G11C 11/4097; G11C 11/5628;
  (Continued)

(56) References Cited

U.S. PATENT DOCUMENTS

| 5,910,794 A | 6/1999 | Schneider |
| 7,808,844 B2 | 10/2010 | Lynch et al. |

(Continued)

FOREIGN PATENT DOCUMENTS

| CN | 101409562 | 2/2012 |
| CN | 101958720 | 3/2013 |

(Continued)

OTHER PUBLICATIONS

Karkooti, M., Radosavljevic, P., & Cavallaro, J. R. (Sep. 2006). Configurable, high throughput, irregular LDPC decoder architecture: Tradeoff analysis and implementation. In Application-specific Systems, Architectures and Processors, 2006. ASAP'06. International Conference on (pp. 360-367). IEEE.

(Continued)

*Primary Examiner* — Hiep Nguyen
(74) *Attorney, Agent, or Firm* — ZIP Group PLLC

(57) ABSTRACT

A quarter product code codeword includes various R code symbols and C code symbols each including a plurality of symbols. Each symbol is loaded into a diagonal anti-diagonal structure in two unique locations. To provide for fast loading, the symbols may be shifted by one or more shift registers associated with the diagonal or anti-diagonal structure. The two locations at which each symbol is positioned are included within different diagonals or anti-diagonals making it possible to load or unload either symbol or multiple symbols in a single clock cycle. Further, by partitioning the diagonal anti-diagonal structure, multiple respective symbols or plurality of symbols may be loaded or unloaded in a single clock cycle.

18 Claims, 32 Drawing Sheets

(52) U.S. Cl.
CPC .......... *G06F 3/0644* (2013.01); *G06F 3/0673* (2013.01); *H03M 13/616* (2013.01)

(58) Field of Classification Search
CPC . G11C 11/5642; G06F 3/0619; G06F 3/0644; G06F 3/0673; G06F 3/0613; H03M 13/2921; H03M 13/616
See application file for complete search history.

(56) References Cited

U.S. PATENT DOCUMENTS

| | | | |
|---|---|---|---|
| 8,176,381 | B2 | 5/2012 | Djordjevic et al. |
| 8,629,492 | B2 | 1/2014 | Aochi et al. |
| 8,812,939 | B2 | 8/2014 | Yang et al. |
| 9,647,694 | B2 * | 5/2017 | Blaettler ........... H03M 13/2921 |
| 2012/0063533 | A1 | 3/2012 | Fonseka et al. |
| 2012/0260150 | A1 | 10/2012 | Cideciyan et al. |
| 2013/0013974 | A1 | 1/2013 | Cideciyan et al. |
| 2013/0159618 | A1 | 6/2013 | Cooke |

FOREIGN PATENT DOCUMENTS

| | | |
|---|---|---|
| CN | 103929194 | 7/2014 |
| KR | 101307733 | 9/2013 |

OTHER PUBLICATIONS

Blaettler, Tobias et al., U.S. Appl. No. 14/100,883, Multidimenstional Storage Array Access, filed Dec. 9, 2013.
Papandreou, Nikolaos et al., GB Application 1407279.7, Error-Correction Encoding and Decoding, Apr. 24, 2014.
Van, Vo Tam et al., "A Novel Error Correcting System Based on Product Codes for Future Magnetic Recording Channels," IEEE Transactions on Magnetics, vol. 47, No. 10 , Oct. 2011.
Yang, Chengen et al., "Product Code Schemes for Error Correction in MLC NAND Flash Memories," IEEE Transactions on Very Large Scale Integration (VLSI) Systems, Mar. 13, 2011.
List of IBM Patents or Patent Applications Treated As Related, dated herewith.

* cited by examiner

DIAGONAL ANTI-DIAGONAL MEMORY STRUCTURE

FIELD

Embodiments of invention generally relate to storage systems and storage devices, and more particularly to a diagonal anti-diagonal memory structure.

DESCRIPTION OF THE RELATED ART

Storage controllers, microprocessors, and other data processing devices often operate on data organized as an two dimensional array of multiple rows and columns. In various applications, it may be desirable to access data corresponding to a particular row or access data corresponding to a particular column. One exemplary application may be iterative error correction code (ECC) schemes, e.g. Turbo Codes, etc. for modern Flash memory devices that exhibit errors when data is retrieved from the memory devices. These error correction techniques often require data to be processed as a two dimensional array with high-speed access to both rows and columns.

Error-correction encoding is employed in data storage and communications systems to improve the accuracy with which data can be recovered from the data channel. By encoding data in accordance with an ECC before supply to the channel, errors at the channel output can be identified and corrected to an extent dependent on the properties of the code. Numerous such ECC schemes are known. One well-known class of ECC scheme is based on product codes. A product code uses two component ECC codes to encode rows and columns of a two-dimensional array of input data.

The basic principle of these codes is indicated in FIG. 1 of the accompanying drawings and is described briefly below. The basic structure of an exemplary product code is illustrated schematically in FIG. 1. The input data symbols are assigned to respective symbol locations in a notional array having rows and columns of symbol locations. In this example, data symbols are assigned to respective locations in a subarray. The resulting array of input data symbols is encoded by separately encoding the rows and columns of the array. A first ECC code C1 is used to encode the associated symbol data word in each row of the array into a C1 codeword. This example uses systematic encoding, whereby the input data is retained in the codeword. In particular, the code symbols of the C1 codeword are obtained by adding parity symbols after the symbol data word in a given row. A second ECC code C2 is then used to encode the symbols in each column of the array into a C2 codeword, by adding parity symbols at the end of each column. The resulting code symbols in the array form the output codeword of the product code.

Product codes can offer practical encoder/decoder implementations, since their decoders can be being hard-decision based and thus avoiding the various complexity/latency issues associated with soft-decision decoding. Some decoders for interleaved product codes use the technique of iterative decoding based on a graph defined from the basic code structure. Briefly, a bipartite graph can be defined with right nodes, each corresponding to a C1 codeword, and left nodes corresponding to respective C2 codewords. Each right node is connected to each left node. Iterative decoding is performed based on the graph by decoding the C1 codewords one-by-one, then decoding the C2 codewords one-by-one. Each time a codeword is successfully decoded, the edges leaving the appropriate node are corrected. The process iterates until decoding is complete.

Another ECC scheme based on product codes was proposed in the context of optical transmission networks in 'Error correcting coding for OTN', J. Justesen, IEEE Communications Magazine, September 2010, and 'Performance of Product Codes and Related Structures with Iterative Decoding', J. Justesen, IEEE Transactions on Communications, 2011. These codes, referred to as "half product codes", are based on product codes which use identical codes for the code C1 and the code C2. A codeword of C can be defined by an matrix X corresponding to the notional array described above, where each row and column of X is a codeword of the row/column code. By construction, every codeword has a zero diagonal (where the diagonal is defined here as the line of symbols extending diagonally across the matrix from the top left symbol to the bottom right symbol). That is, all symbols on the diagonal are of value zero and symbols in the triangular subarray on each side of the diagonal are the same.

Yet another ECC scheme is based on "quarter product codes". These codes are based on an underlying product code with row and columns codes which are not only identical but also reversible. With a reversible code, reversing the symbol order of any codeword produces another codeword of the code. Coding and decoding can be based on the underlying product code C, offering practical encoder/decoder implementations for quarter product codes. In particular, after assigning the input data symbols to locations in the notional array, row and columns of the array are encoded in dependence on the product code so as to produce a codeword. Such a quarter product codeword has an additional degree of symmetry compared to the half product codes. By construction, the array of code symbols defining every codeword of a quarter product code has a zero diagonal and a zero anti-diagonal. By virtue of the symmetry, the set of code symbols corresponding to locations in each triangular subarray confined between the diagonal and anti-diagonal are the same. These code symbols thus define the quarter product codeword, whereby the quarter product code has an effective length less than half that of an equivalent half product code. FIG. 2 shows a matrix representation of a simple example of a quarter product codeword. All symbols on the matrix diagonal and anti-diagonal are of value zero. In addition, the set of symbols in the shaded triangular subarray confined between the matrix diagonal and anti-diagonal of the n-by-n array is the same set which appears in each of the other three similar triangular subarrays. Specifically, the symbol at any given location in the shaded subarray also appears at mirror locations obtained by reflecting the symbol in the diagonal and anti-diagonal. Thus, for symbol $y_{31}$ in the shaded subarray, reflecting this symbol in the diagonal and anti-diagonal puts like symbols at the mirror locations indicated in the figure. By virtue of this symmetry, the quarter product codeword is completely defined by the set of code symbols in any one of the four triangular subarrays confined between diagonals.

To deliver high performance, the processing of data in multiple dimensions requires that the data be transposed with low overhead and is difficult to achieve utilizing a quarter product code scheme since similar symbols are included in multiple locations in the array. Traditional loading and retrieving techniques, such as storing data in association with a quarter product code schemes, do not deliver the level of throughput required at high bandwidths to achieve anticipated performance requirements.

SUMMARY

In a first embodiment of the present invention, a diagonal anti-diagonal storage structure is presented. The diagonal anti-diagonal storage structure includes a diagonal storage subarray and an anti-diagonal storage subarray. The diagonal storage subarray and the anti-diagonal storage subarray each include a plurality of storage locations arranged in a plurality of vertical stacks, a plurality of mirrored storage locations that are reflections of the storage locations against a central subarray bisector, and a plurality of partitions.

In another embodiment of the present invention, a diagonal anti-diagonal storage structure access method is presented. The method includes unloading a first code symbol from a first partition of the diagonal anti-diagonal storage structure at a particular clock cycle and simultaneously unloading a second code symbol from a second partition of the diagonal anti-diagonal storage structure at the particular clock cycle. The first code symbol includes a first plurality of symbols and the second code symbol includes a second plurality of symbols. The first partition includes a first portion of the first partition within a diagonal storage subarray and a second portion of the first partition within an anti-diagonal storage subarray. The second partition includes a first portion of the second partition within the diagonal storage subarray and a second portion of the second partition within the anti-diagonal storage subarray.

In yet another embodiment of the present invention, a computer program product for accessing a diagonal anti-diagonal storage structure is presented. The computer program product includes a computer readable storage medium having program code embodied therewith. The program code is executable to unload a first code symbol from a first partition of the diagonal anti-diagonal storage structure at a particular clock cycle and simultaneously unload a second code symbol from a second partition of the diagonal anti-diagonal storage structure at the particular clock cycle. The first code symbol includes a first plurality of symbols and the second code symbol includes a second plurality of symbols. The first partition includes a first portion of the first partition within a diagonal storage subarray and a second portion of the first partition within an anti-diagonal storage subarray. The second partition includes a first portion of the second partition within the diagonal storage subarray and a second portion of the second partition within the anti-diagonal storage subarray.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figures 1, 2:
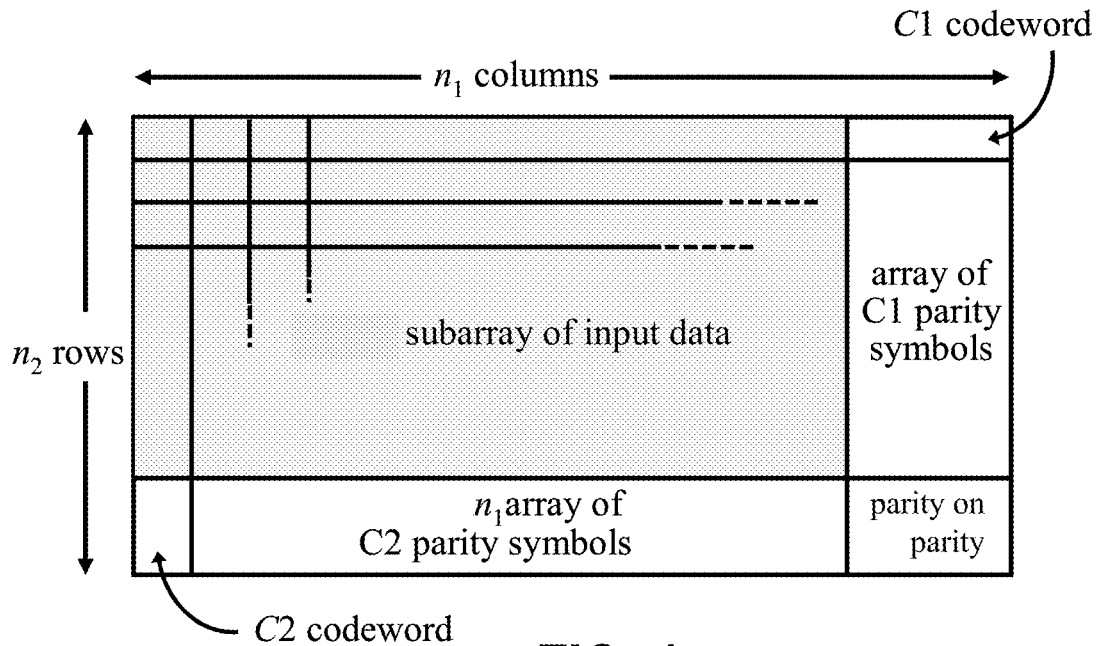
FIG. 1 illustrates a known structure of an exemplary product codeword.
FIG. 2. illustrates a known structure of an exemplary quarter product codeword.

In various embodiments, a QPC codeword includes various R code symbols and C code symbols each including a plurality of symbols. Code symbols are loaded into a diagonal anti-diagonal structure in two unique locations. To provide for fast loading, the symbols may be shifted by one or more shift registers associated with each diagonal or anti-diagonal of the structure. The two locations at which each symbol is positioned correspond to a different diagonal or anti-diagonal and it is possible to load or unload each symbol or multiple symbols in a single clock cycle. Further, by partitioning the diagonal anti-diagonal structure, multiple respective symbols or plurality of symbols may be loaded or unloaded in a single clock cycle.

Details of the claimed embodiments are disclosed herein. However, it is understood that the disclosed embodiments are merely illustrative of the structures, devices, systems, methods, etc. that may be embodied in various forms. These exemplary embodiments are provided so that this disclosure will be thorough and complete and will convey the scope of this invention to those skilled in the art. In the description, details of well-known features and techniques may be omitted to avoid unnecessarily obscuring the presented embodiments.

Accordingly, aspects of the present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. It should be appreciated that the present invention can be implemented with a wide range of memory storage mediums, including for example non-volatile random access memory (NVRAM) technologies such as NAND flash memory, NOR flash memory, phase-change memory (PCM or PRAM), magnetoresistive RAM (MRAM) and resistive RAM (RRAM) as well as combinations thereof. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The drawings are not necessarily to scale. The drawings are merely schematic representations, not intended to portray specific parameters of the invention. The drawings are intended to depict only exemplary embodiments of the invention. In the drawings, like numbering represents like elements.

Figure 3:
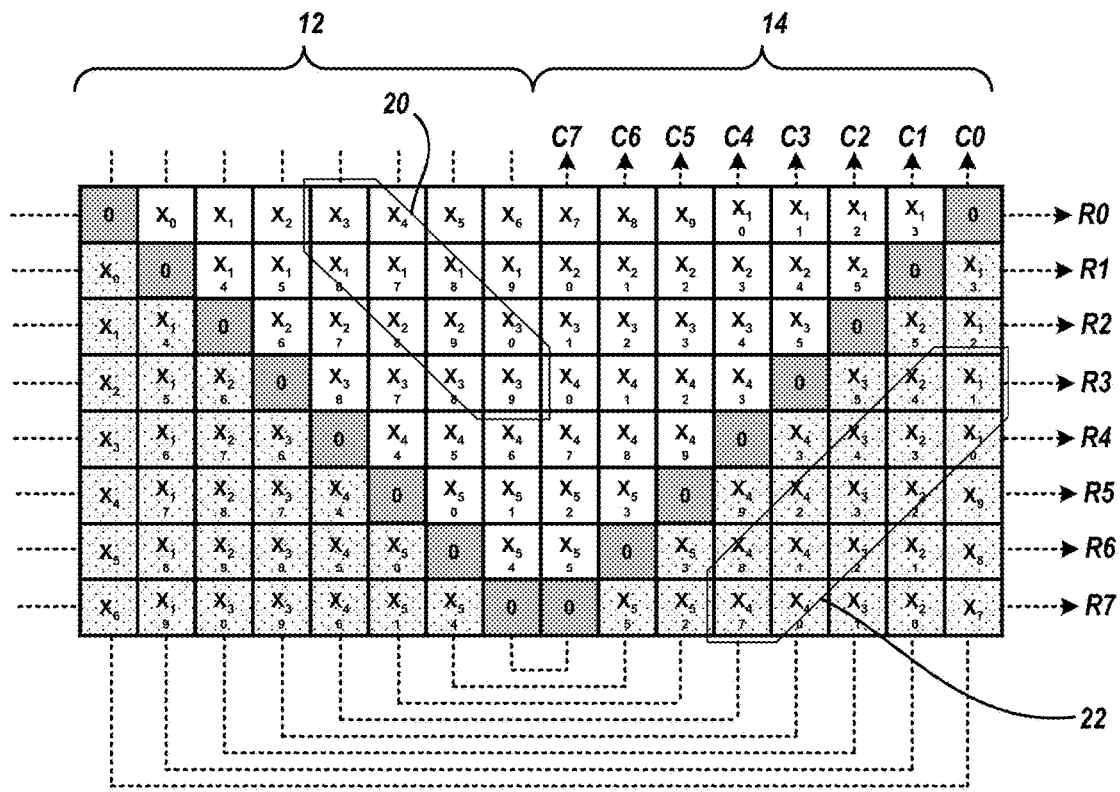
FIG. 3 illustrates another structure of an exemplary quarter product codeword.

FIG. 3 illustrates a symmetrical structure of an exemplary quarter product codeword. These codes are based on an underlying product code with row and columns codes which are not only identical but also reversible. With a reversible code, reversing the symbol order of any codeword produces another codeword of the code. By construction, a storage array or matrix 10 of code symbols defining every codeword of a quarter product code $C_Q$ has a zero diagonal and a zero anti-diagonal. By virtue of the symmetry, the set of code symbols corresponding to locations in the triangular subarray confined between the diagonal and anti-diagonal are the same. For example, code symbol "R0" equals code symbol "C0," code symbol "R1" equals code symbol "C1," on so on. These code symbols thus define the quarter product codeword. FIG. 3 shows a matrix representation of a simple example of a quarter product codeword. Matrix 10 includes portion 12 and portion 14 in which symbols are loaded or otherwise assessable. Symbols within portion 12 differ from those in portion 14.

All symbols on the matrix 10 diagonal and anti-diagonal are of value zero. Specifically, the symbol at any given location i,j in the subarray also appears at mirror locations obtained by reflecting the symbol in the diagonal, anti-diagonal, etc. Thus, for symbol $x_{31}$ in the shaded subarray, reflecting this symbol in the anti-diagonal puts a like symbol at the mirrored location. By virtue of this symmetry, the quarter product codeword is completely defined by the set code symbols in any one of the subarrays confined between diagonals. Because each symbol is located in various subarray locations, to load any code symbol multiple clock cycles are needed. Further, to access any code symbol multiple clock cycles may be needed. For example, code symbols R0-R7 may be accessed entirely in one clock cycle. However, multiple clock cycles would be needed to access code symbols C0-C7. To deliver high performance, the processing of quarter product code data in multiple dimensions requires that the data be transposed with reduced clock cycles. Portion 12 may include various diagonals, such as diagonal 20 and portion 14 may include various anti-diagonals, such as anti-diagonal 22.

Consider an example implementing an iterative decoder that decodes in multiple passes code symbols R0-R7. The decoder starts by decoding R0 and after "D" clock cycles determines that there is an error in symbol $x_{13}$ in unshaded portion 14 that needs correcting. In order to achieve good error correction performance, the R0 decoder passes on the associated correction information to the R1 decoder to correct the error in symbol $x_{13}$ in shaded portion 14. However, many clock cycles are required since R1 decoding does not begin until R0 decoding is complete. The total number of clock cycles is given by: num_clock_A=num_iterations*num_rows*D.

However, in another example an iterative decoder that decodes in multiple passes code symbols R0-R7 and C0-C7 allows for high performance throughput decoding. In this decoder, the shaded and unshaded symbols positions are not consistent, i.e., when R0 decoding is complete only the symbol $x_{13}$ in unshaded portion 14 is corrected. Thus, the decoding of each code symbols R0-R7 is independent and mirrored corrections made in the affected code symbols R0-R7 are corrected when code symbols C0-C7 are decoded. Similarly, mirrored corrections made in affected code symbols C0-C7 are corrected in a subsequent decoding of code symbols R0-R7. In this way, correction information is passed back and forth between code symbols R0-R7 and C0-C7 until the errors are corrected. After decoding the last code symbol R7, D clock cycles are needed before starting decoding of the first code symbol C0. Therefore, the number of clock cycles required is: num_clock_B=num_iterations*(D+D)=num_iterations*2*D. D may be on the order of 10 clock cycles, and num_rows=num_cols may be on the order 100, and iterations on the order 10.

In comparing the different decoders, num_clock_A=10*100*10=10,000 and num_clock_B=10*2*(10)=200. As seen, the number of clock cycles of the latter decoder would be over an order of magnitude less and performance is significantly improved. Therefore, in various embodiments of the present invention, a memory structure wherein code symbols in either dimension, e.g., R0-R7 or code symbol C0-C7, etc. may be accessed in reduced clock cycles is provided.

Figure 4:
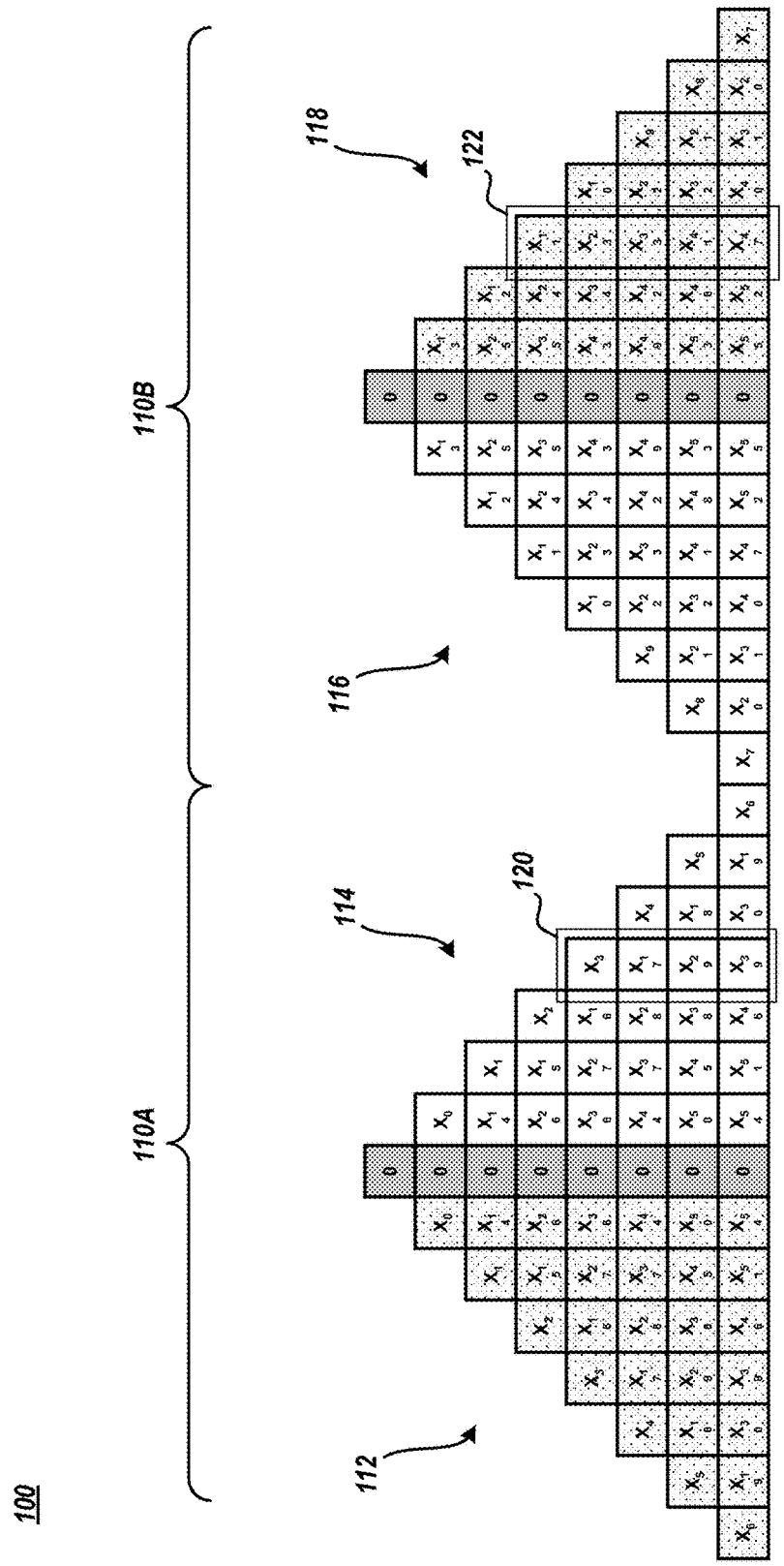
FIG. 4-FIG. 7 depict diagonal anti-diagonal structures of an exemplary quarter product codeword, according to various embodiments of the present invention.
Figure 5A:
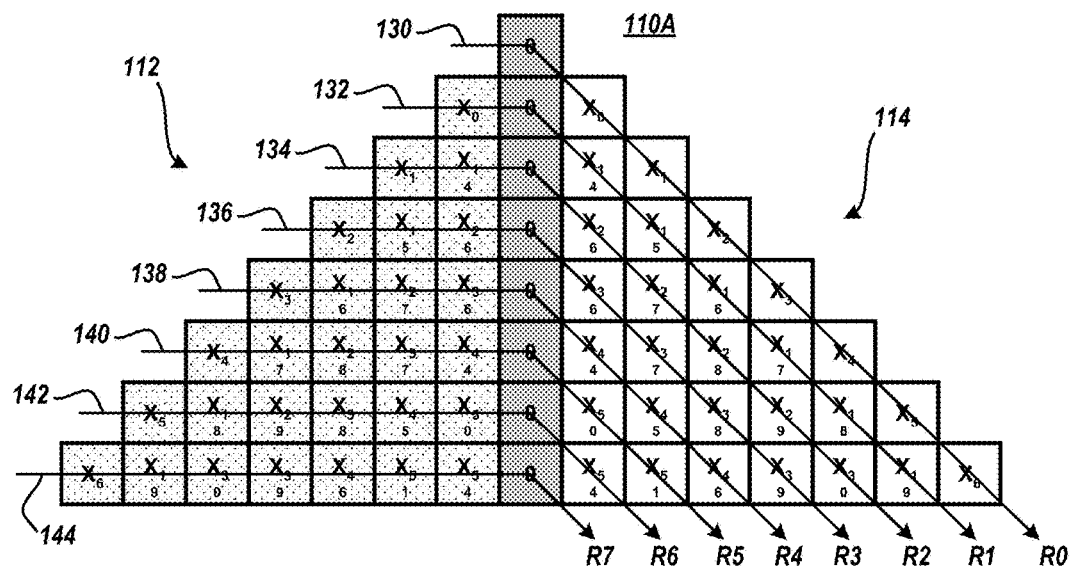
Figure 5B:
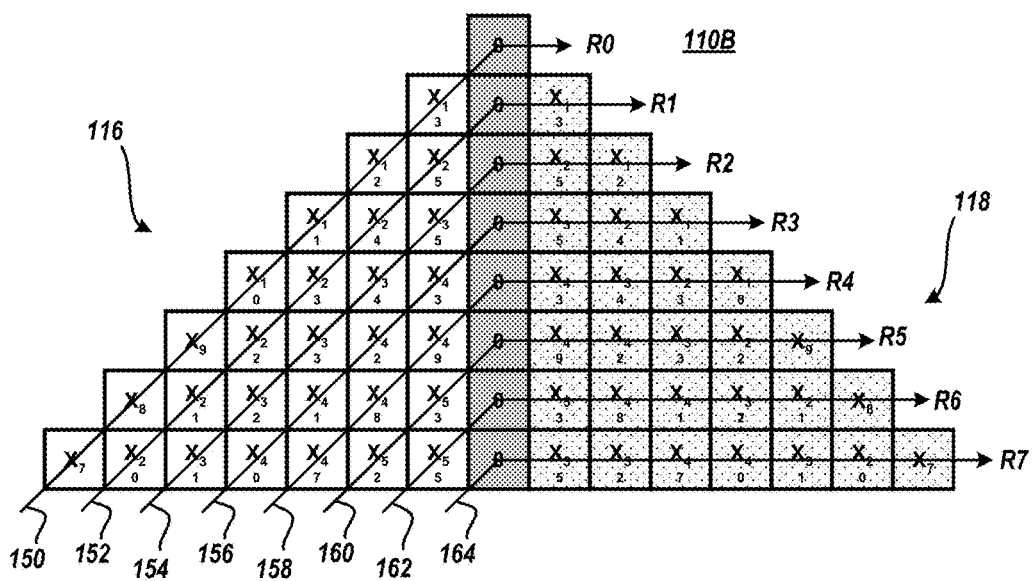

FIG. 4 depicts an exemplary quarter product code diagonal anti-diagonal array structure 100. Structure 100 includes subarrays 110A and 110B. In embodiments, subarray 100A may equivalently store diagonals of array 10 portion 12 and may be referred to as a diagonal structure. Likewise, subarray 100B may equivalently store anti-diagonals of array 10 portion 14 and may be referred to as an anti-diagonal structure.

Structure 100 stores code symbols defining every codeword of a quarter product code. Encoding and decoding can be based on the product code for encoder/decoder implementations for quarter product codes. In particular, after assigning the input data symbols to locations in the structure 100, the symbols are encoded in dependence on the product code so as to produce a codeword that has an additional degree of symmetry compared to the half product codes. By construction, the code symbols defining a codeword of a quarter product code are stored within subarrays 110A, 110B each having a central zero reflective bisector. By virtue of the symmetry, the symbols corresponding to mirrored locations in each subarray are the same. Specifically, the symbol at any given location in subarray 110A, 110B also appears at mirrored locations obtained by reflecting the symbol against the respective central zero reflective bisector. By virtue of this symmetry, the quarter product codeword is completely defined by the set of code symbols in the combination of adjacent subarrays 110A and 110B. For example, symbols $x_{14}$ and $x_1$ located in shaded section 112 of subarray 110A are reflected against the central zero bisector to symbols $x_{14}$ and $x_1$ located in section 114 of subarray 110A. Likewise, symbols $x_{43}$, $x_{34}$, $x_{23}$, and $x_{10}$ located in section 116 of subarray 110B are reflected against the central zero bisector to symbols $x_{43}$, $x_{34}$, $x_{23}$, and $x_{10}$ located in section 118 of subarray 110B.

The exemplary set of symbols located in section 114 and the symbols located in section 116 may be the similar set as those confined between the matrix diagonal and anti-diagonal of array 10. Further, the exemplary set of symbols located in section 112 and the symbols located in section 118 may be the similar set as those confined exterior to the matrix diagonal and anti-diagonal of array 10. In other words, symbols within portion 12 of array 10 may be similar to the symbols within subarray 110A and symbols within portion 14 of array 10 may be similar to the symbols within subarray 110B, etc. For example, diagonal 20 within portion 12 may be similar to vertical stack 120 within section 114 and antidiagonal 22 within portion 14 may be similar to vertical stack 122 within section 118.

As shown in FIG. 5A-FIG. 6B, structure 100 allows for code symbols in either dimension, e.g., R0-R7 or code symbol C0-C7, etc. to be accessed in reduced clock cycles. For example, referring to FIG. 5A and FIG. 5B, code symbol R0 may be accessed by path 130 in subarray 110A concatenated with path 150 in subarray 110B, code symbol R1 may be accessed by path 132 in subarray 110A concatenated with path 152 in subarray 110B, code symbol R2 may be accessed by path 134 in subarray 110A concatenated with path 154 in subarray 110B, code symbol R3 may be accessed by path 136 in subarray 110A concatenated with path 156 in subarray 110B, code symbol R4 may be accessed by path 138 in subarray 110A concatenated with path 158 in subarray 110B, code symbol R5 may be accessed by path 140 in subarray 110A concatenated with path 160 in subarray 110B, code symbol R6 may be accessed by path 142 in subarray 110A concatenated with path 162 in subarray 110B, and code symbol R7 may be accessed by path 144 in subarray 110A concatenated with path 164 in subarray 110B. Since each symbol of code symbols R0-R7 lay in an independent horizontal location within subarray 110A and subarray 110B, respectively, each code symbol R0-R7 may be accessed in a single clock cycle.

Figure 6A:
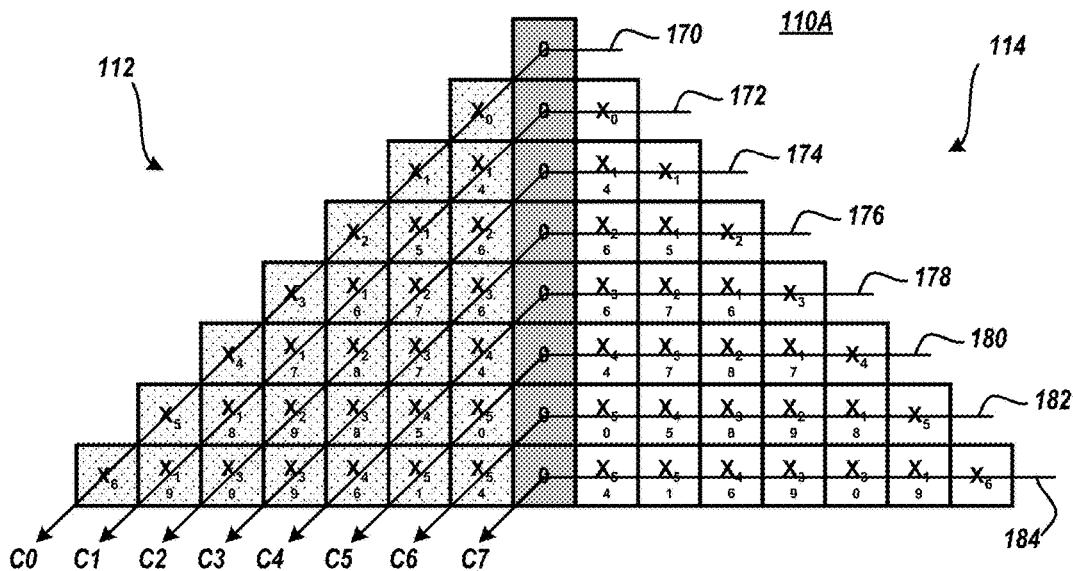
Figure 6B:
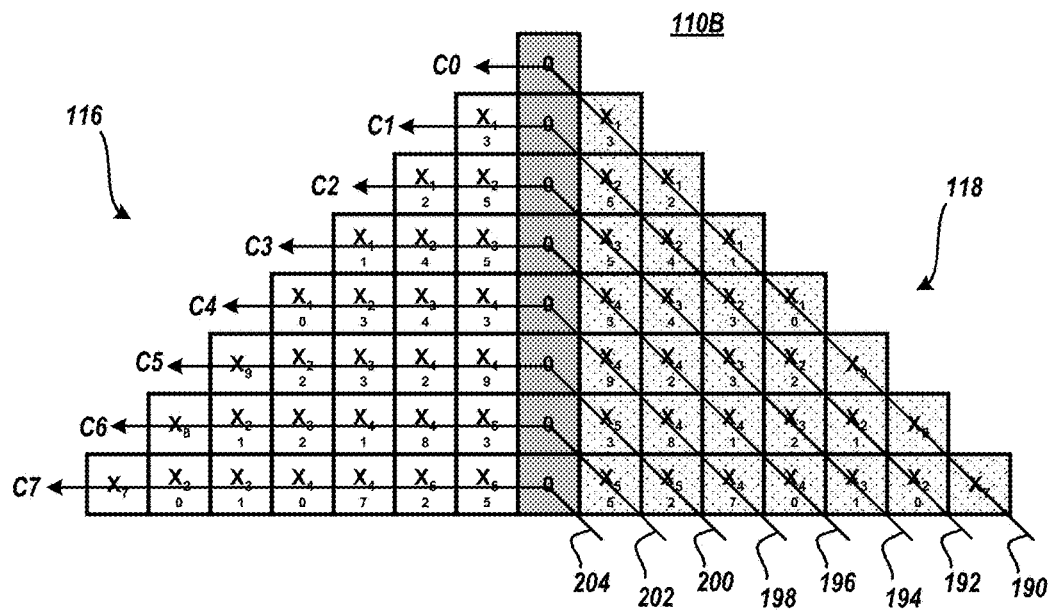

Referring to FIG. 6A and FIG. 6B, code symbol C0 may be accessed by path 170 in subarray 110A concatenated with path 190 in subarray 110B, code symbol C1 may be accessed by path 172 in subarray 110A concatenated with path 192 in subarray 110B, code symbol C2 may be accessed by path 174 in subarray 110A concatenated with path 194 in subarray 110B, code symbol C3 may be accessed by path 176 in subarray 110A concatenated with path 196 in subarray 110B, code symbol C4 may be accessed by path 178 in subarray 110A concatenated with path 198 in subarray 110B, code symbol C5 may be accessed by path 180 in subarray 110A concatenated with path 200 in subarray 110B, code symbol C6 may be accessed by path 182 in subarray 110A concatenated with path 202 in subarray 110B, and code symbol C7 may be accessed by path 184 in subarray 110A concatenated with path 204 in subarray 110B. Though FIG. 5A-FIG. 6B are depicted in reference to subarrays 110A, 110B, similar paths may exist between adjacent subarrays (e.g., subarray 110A and 110C, etc.) to access code symbols. Further, since each symbol of code symbols R0-R7 and code symbols C0-C7 lay in independent horizontal locations within subarray 110A and subarray 110B, respectively, each code symbol R0-R7 or code symbol C0-C7 may be accessed in a single clock cycle. In other words, since the locations of symbols correspond to different diagonals or antidiagonals it is possible to load or retrieve one or more symbols of each code symbol R0-R7 or code symbol C0-C7 in a single clock cycle.

Each of the subarrays 110A, 110B, etc. may be divided into partition structures to provide for parallel access where multiple code symbols may be accessed in parallel. In embodiments, the subarrays 110A, 110B may be divided into P>1 partition structures so that any P code symbols may be accessed in a single clock cycle in parallel. In embodiments, the maximum value P is half of the number of central zeros.

Figure 7:
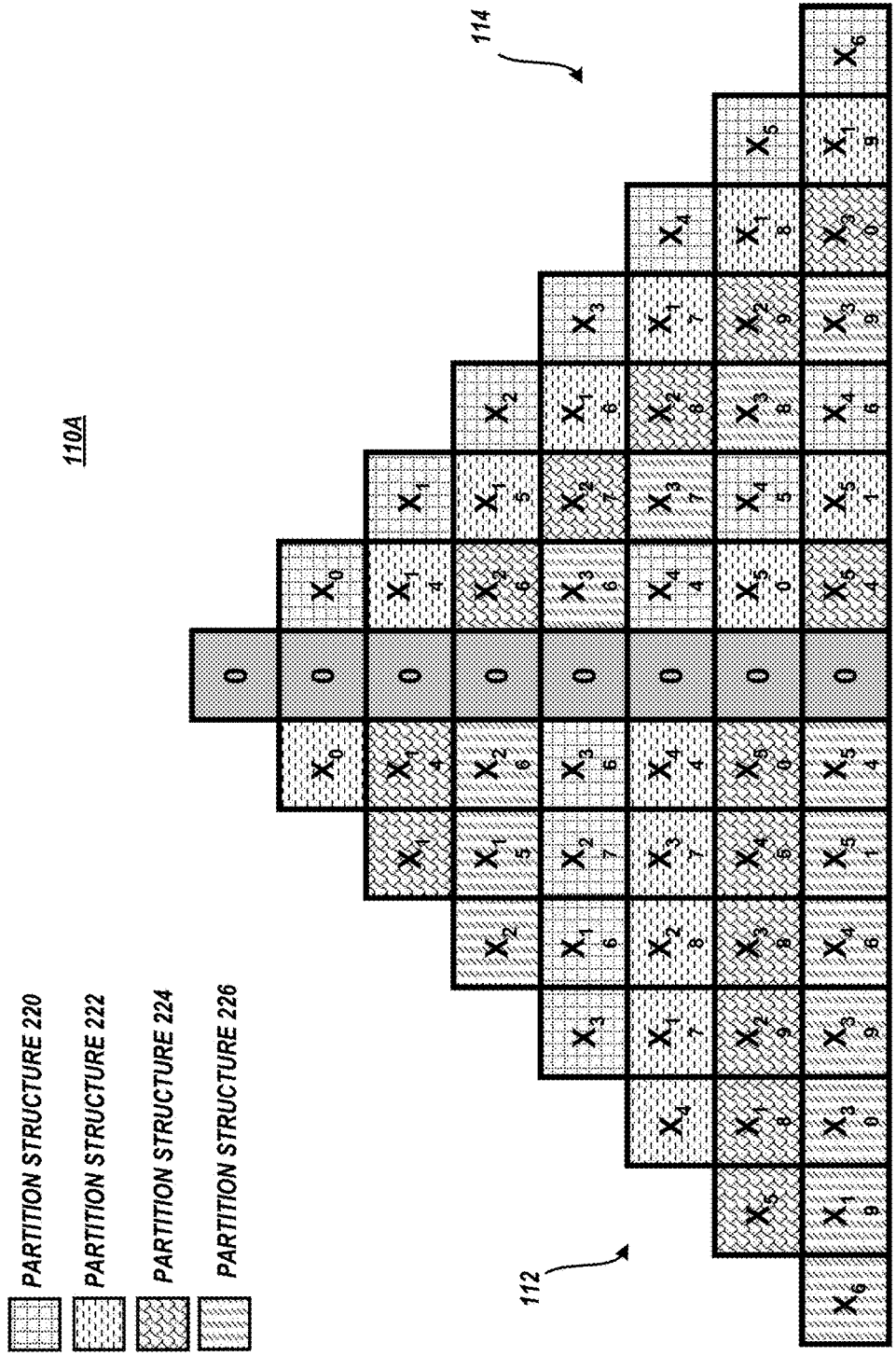

As shown in FIG. 7, subarray 110A may be divided into four partition structures 220, 222, 224, and 226. In embodiments, partition structures 220, 222, 224, and 226 are divided such that a single symbol is assigned to each partition structure 220, 222, 224, and 226 within every vertical stack of subarray 110A associated with the code symbols to be accessed in parallel. For example, symbol $x_0$ is the only symbol assigned to partition structure 222 within the R0-R3 vertical stack consisting of symbol $x_0$, symbol $x_{14}$, and symbol $x_{26}$. Likewise, symbol $x_2$ is the only symbol assigned to partition structure 220 within the R0-R3 vertical stack consisting of symbol $x_2$, symbol $x_{16}$, symbol $x_{28}$, and symbol $x_{38}$. Further, symbol $x_{26}$ is the only symbol assigned to partition structure 224 within the C0-C3 vertical stack consisting of symbol $x_0$, symbol $x_{14}$, and symbol $x_{26}$. Even further, symbol $x_{39}$ is the only symbol assigned to partition structure 226 within the C0-C3 vertical stack consisting of symbol $x_3$, symbol $x_{17}$, symbol $x_{29}$, and symbol $x_{39}$. Likewise, symbol $x_{54}$ is the only symbol assigned to partition structure 222 within the R4-R7 vertical stack consisting of symbol $x_{36}$, symbol $x_{44}$, symbol $x_{50}$, and symbol $x_{54}$. Similarly, symbol $x_{39}$ is the only symbol assigned to partition structure 226 within the C4-C7 vertical stack consisting of symbol $x_3$, symbol $x_{17}$, symbol $x_{29}$, and symbol $x_{39}$. For clarity, the subarray 110B may be partitioned into similar respective partitions.

Figure 8:
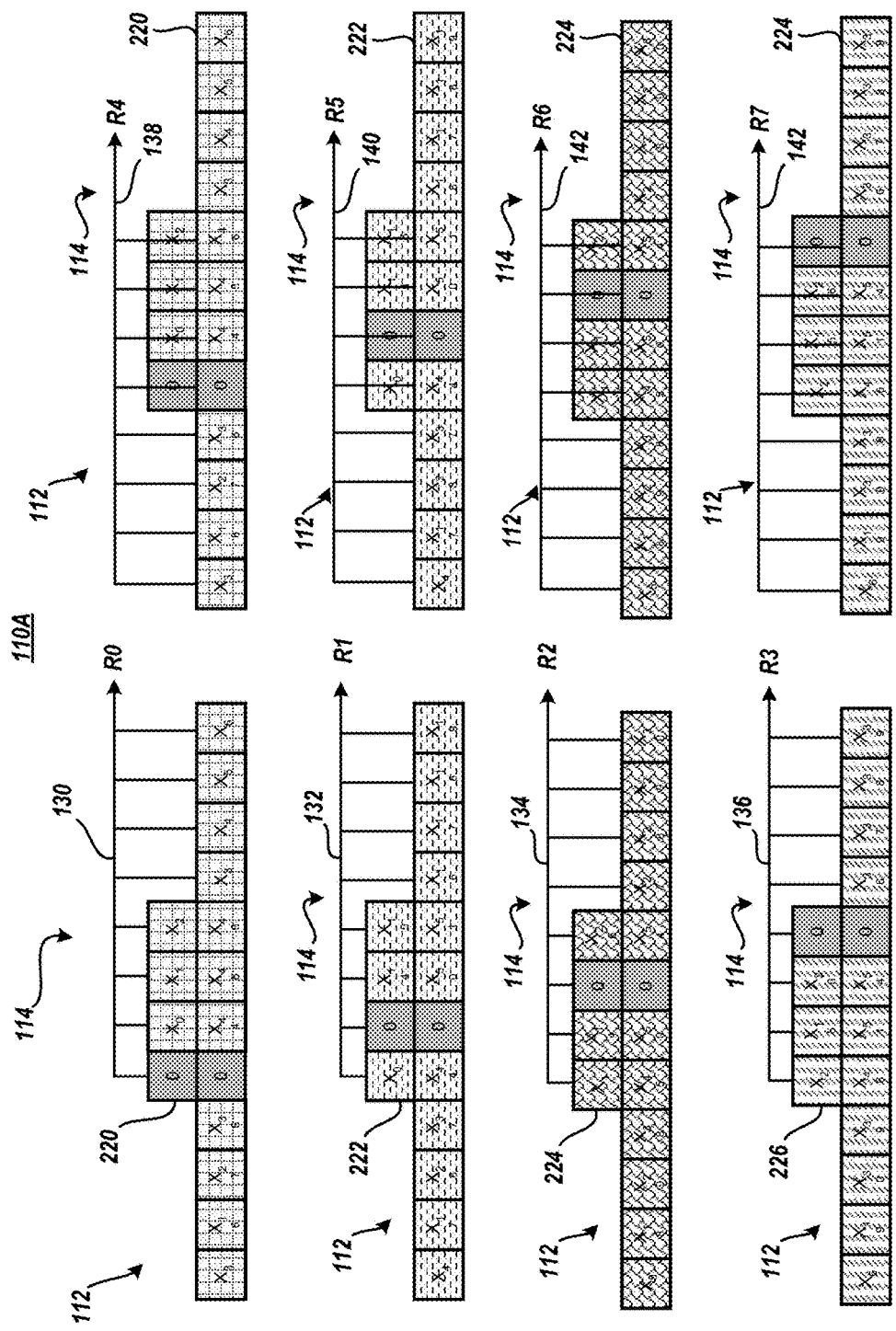
FIG. 8-FIG. 9B depict parallel access from a diagonal anti-diagonal structure, according to various embodiments of the present invention.

As shown in FIG. 8, the subarray 110A portion of code symbol R0 may be accessed via partition structure 220 upon path 130, the subarray 110A portion of code symbol R1 may be accessed via partition structure 222 upon path 132, the subarray 110A portion of code symbol R2 may be accessed via partition structure 224 upon path 134, and the subarray 110A portion of code symbol R3 may be accessed via partition structure 226 upon path 136. The subarray 110B portions of code symbols R0-R3 may be similarly accessed in parallel and concatenated with the subarray 110A portions of code symbols R0-R3 to access code symbols R0-R3 in one clock cycle. Likewise, the subarray 110A portion of code symbol R4 may be accessed via partition structure 220 upon path 138, the subarray 110A portion of code symbol R5 may be accessed via partition structure 222 upon path 140, the subarray 110A portion of code symbol R6 may be accessed via partition structure 224 upon path 142, and the subarray 110A portion of code symbol R7 may be accessed via partition structure 226 upon path 144. The subarray 110B portions of code symbols R4-R7 may be similarly accessed in parallel and concatenated with the subarray 110A portions of code symbols R4-R7 to access code symbols R4-R7 in one clock cycle.

Figure 9A:
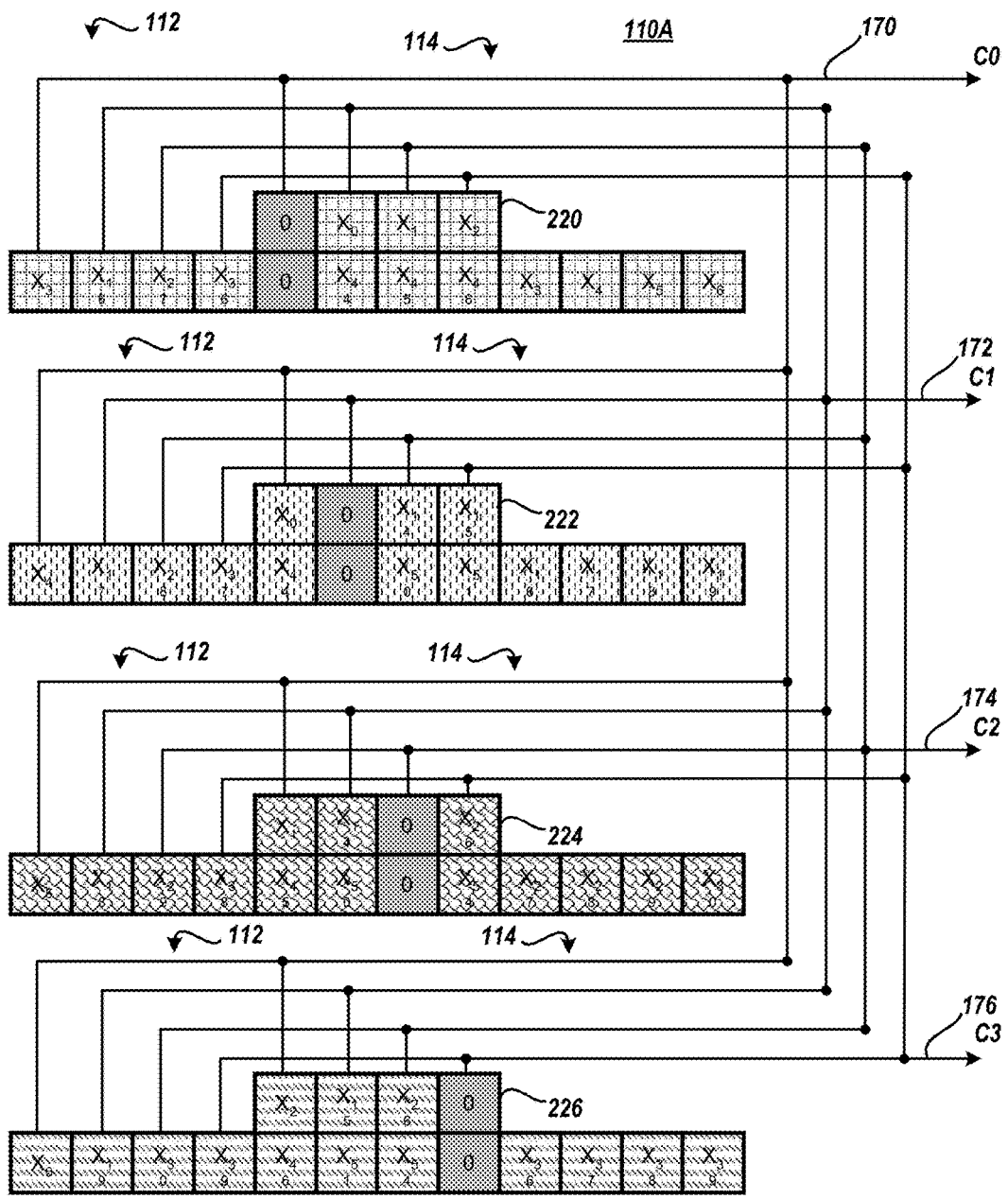
Figure 9B:
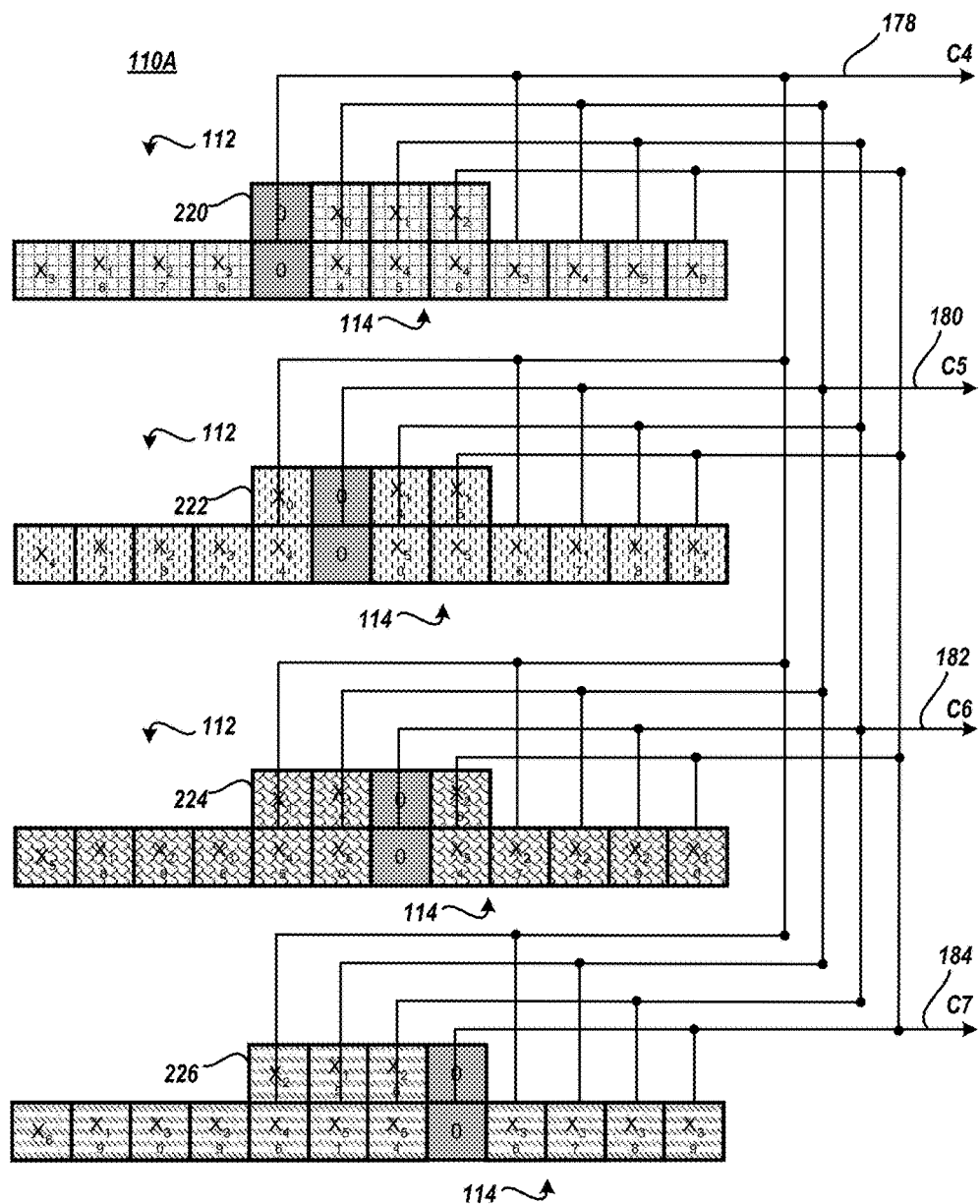

Similarly, as shown in FIG. 9A-FIG. 9B, the subarray 110A portion of code symbol C0 may be accessed via partition structures 220, 222, 224, and 226 upon path 170, the subarray 110A portion of code symbol C1 may be accessed via partition structures 220, 222, 224, and 226 upon path 172, the subarray 110A portion of code symbol C2 may be accessed via partition structures 220, 222, 224, and 226 upon path 174, and the subarray 110A portion of code symbol C4 may be accessed via partition structures 220, 222, 224, and 226 upon path 176. The subarray 110B portions of code symbols C0-C3 may be similarly accessed in parallel and concatenated with the subarray 110A portions of code symbols C0-C3 to access code symbols C0-C3 in one clock cycle. Likewise, as shown in FIG. 9B, the subarray 110A portion of code symbol C4 may be accessed via partition structures 220, 222, 224, and 226 upon path 178, the subarray 110A portion of code symbol C5 may be accessed via partition structures 220, 222, 224, and 226 upon path 180, the subarray 110A portion of code symbol C6 may be accessed via partition structures 220, 222, 224, and 226 upon path 182, and the subarray 110A portion of code symbol C7 may be accessed via partition structures 220, 222, 224, and 226 upon path 184. The subarray 110B portions of code symbols C4-C7 may be similarly accessed in parallel and concatenated with the subarray 110A portions of code symbols C4-C7 to access code symbols C4-C7 in one clock cycle.

Figure 10:
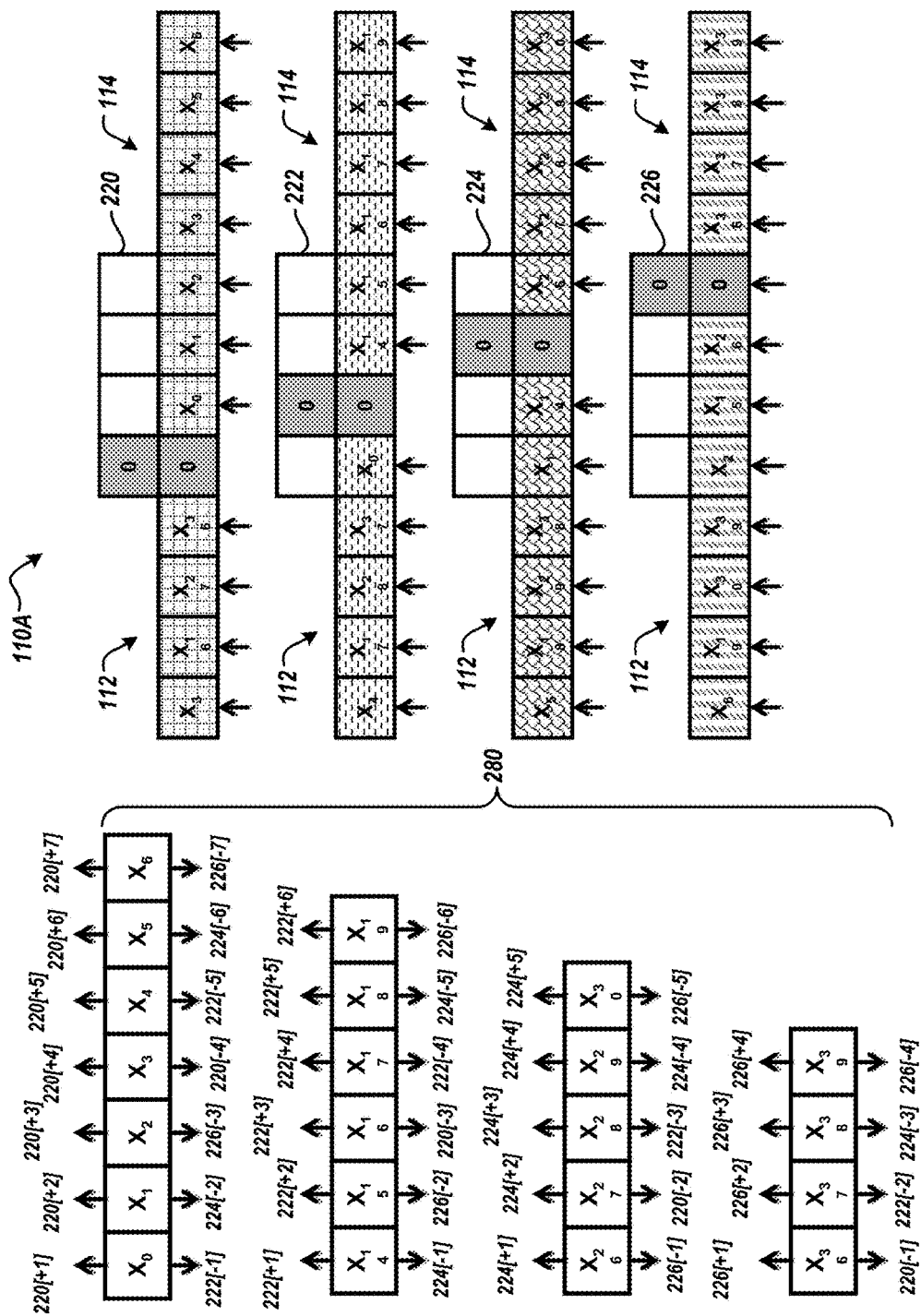
FIG. 10-FIG. 11 depict loading to a diagonal anti-diagonal structure, according to various embodiments of the present invention.
Figure 11:
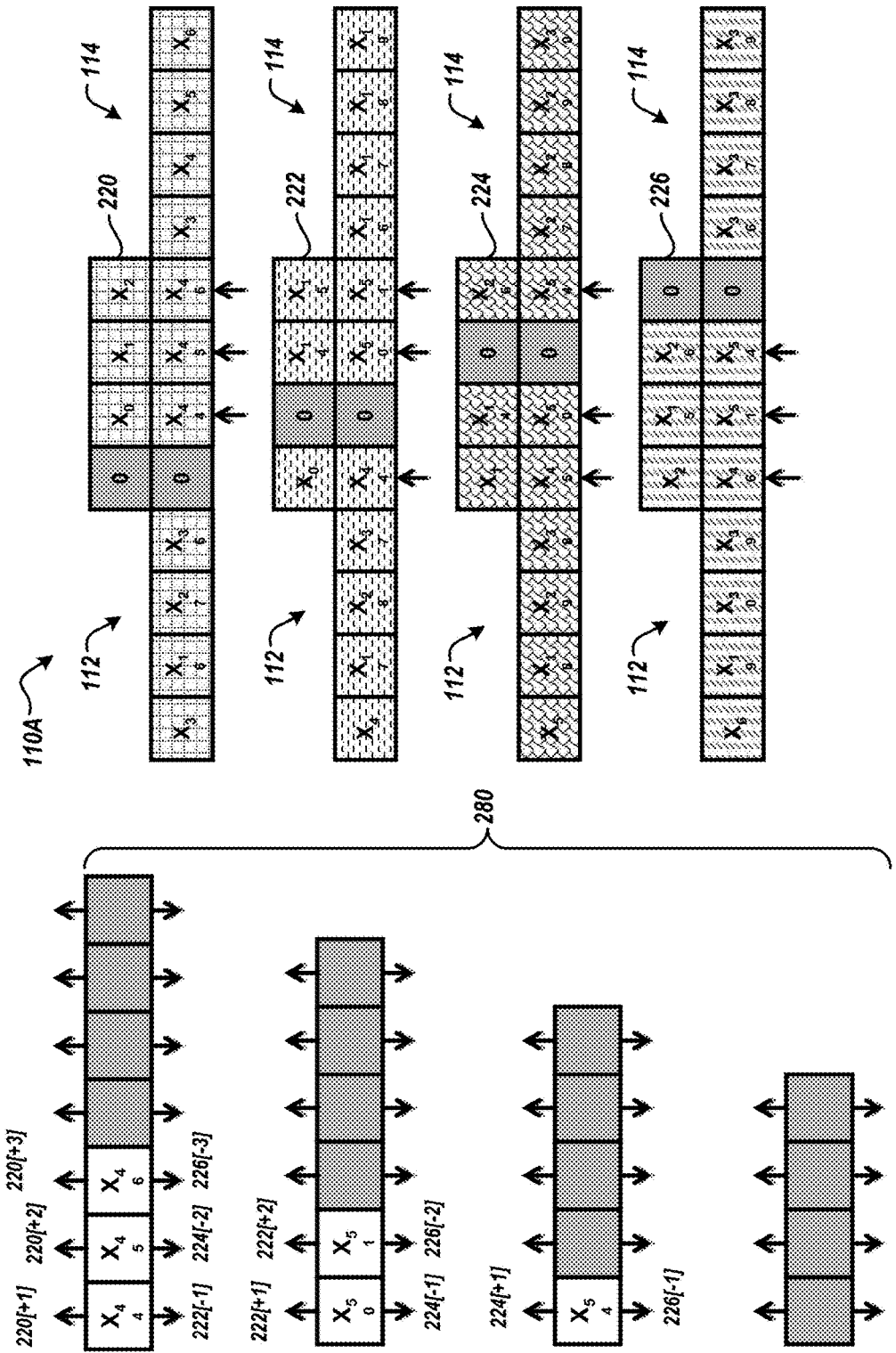

FIG. 10-FIG. 11 depict loading of diagonal anti-diagonal structure 100. In embodiments structure 100 may be loaded via a buffer. FIG. 10 generally depicts the loading of subarray 110A of diagonal anti-diagonal structure 100 at a first clock cycle and FIG. 11 generally depicts the loading of subarray 110A at a subsequent clock cycle.

When loading to diagonal anti-diagonal structure 100 each symbol of a code symbol is loaded twice and loaded into a different diagonal. In embodiments, each diagonal or anti-diagonal symbol is loaded into a separate shift register. In other words, each vertical stack of anti-diagonal structure 100 may be associated with a particular shift register. A particular code symbol, e.g., R0-R7, C0-C7, etc. or portion of the code symbol may be loaded into applicable shift registers that subsequently positions each symbol of the code symbol into a different structure 100 diagonal or antidiagonal. In embodiments, anti-diagonal structure 100 may utilize a buffer to store one or more code symbols for the loading of symbols into associated shift registers. When the buffer is full of applicable code symbols, the buffer may be unloaded into the shift registers of structure 100 in a single clock cycle.

At a first loading clock cycle, symbols may be loaded into each shift register and the number of symbols loaded into applicable shift registers decreases as the load progresses. Though data loaded into structure 100 is loaded in association with shift registers, data may be unloaded without shifting.

An exemplary loading of a code word into a subarray is now described, with reference to FIG. 10 and FIG. 11. The 110A portion of the R0/C0 code symbol is locally stored in the buffer and includes symbols $x_0$, $x_1$, $x_2$, $x_3$, $x_4$, $x_5$, and $x_6$ that are to be stored in subarray 110A. The R0 code symbol portion of symbols is loaded from the buffer to respective shift registers that positions symbol $x_0$ within partition 220 lower location [+1], $x_1$ within partition 220 lower location [+2], $x_2$ within partition 220 lower location [+3], $x_3$ within partition 220 lower location [+4], $x_4$ within partition 220 lower location [+5], $x_5$ within partition 220 lower location [+6], and $x_6$ within partition 220 lower location [+7], wherein the [z] indicates horizontal position relative to the central zeros. In other words, no relative symbol shifting is needed to load the code symbol $R_0$ symbols $x_0$, $x_1$, $x_2$, $x_3$, $x_4$, $x_5$, and $x_6$ into section 114 of subarray 110A. Likewise, the C0 code symbol portion of symbols is loaded from the buffer to respective shift registers that positions symbol $x_0$ within partition 222 lower location [−1], $x_1$ within partition 224 lower location [−2], $x_2$ within partition 226 lower location [−3], $x_3$ within partition 220 lower location [−4], $x_4$ within partition 222 lower location [−5], $x_5$ within partition 224 lower location [−6], and $x_6$ within partition 226 lower location [−7]. In other words, the relative logical order of the code symbol C0 symbols $x_0$, $x_1$, $x_2$, $x_3$, $x_4$, $x_5$, and $x_6$ is reversed by the shift registers for loading into section 112 of subarray 110A. In embodiments, the C0 symbols $x_0$, $x_1$, $x_2$, $x_3$, $x_4$, $x_5$, and $x_6$ may be interleaved across partitions 220, 222, 224, and 226.

Likewise, the 110A portion of the R1/C1 code symbol is locally stored in the buffer and includes symbols $x_{14}$, $x_{15}$, $x_{16}$, $x_{17}$, $x_{18}$, and $x_{19}$ to be stored in subarray 110A. The R1 code symbol portion of symbols is loaded from the buffer to respective shift registers that positions symbol $x_{14}$ within partition 222 lower location [+1], xis within partition 222 lower location [+2], $x_{16}$ within partition 222 lower location [+3], $x_{17}$ within partition 222 lower location [+4], $x_{18}$ within partition 222 lower location [+5], and $x_{19}$ within partition 222 lower location [+6]. In other words, no relative symbol shifting is needed to load the code symbol R1 symbols $x_{14}$, $x_{15}$, $x_{16}$, $x_{17}$, $x_{18}$, and $x_{19}$ into section 114 of subarray 110A. Similarly, the C1 symbols $x_{14}$, $x_{15}$, $x_{16}$, $x_{17}$, $x_{18}$, and $x_{19}$ are loaded from the buffer to respective shift registers that positions symbol $x_{14}$ within partition 224 lower location [−1], $x_{15}$ within partition 226 lower location [−2], $x_{16}$ within partition 220 lower location [−3], $x_{17}$ within partition 222 lower location [−4], $x_{18}$ within partition 224 lower location [−5], and $x_{19}$ within partition 226 lower location [−6]. In other words, the relative logical order of the C1 symbols $x_{14}$, $x_{15}$, $x_{16}$, $x_{17}$, $x_{18}$, and $x_{19}$ are reversed by the shift registers for loading into section 112 of subarray 110A.

Further, the 110A portion of the R2/C2 code symbol is locally stored in the buffer and includes symbols $x_{26}$, $x_{27}$, $x_{28}$, $x_{29}$, and $x_{30}$ to be stored in subarray 110A. The R2 code symbol portion of symbols is loaded from the buffer to respective shift registers that positions symbol $x_{26}$ within partition 224 lower location [+1], $x_{27}$ within partition 224 lower location [+2], $x_{28}$ within partition 224 lower location [+3], $x_{29}$ within partition 224 lower location [+4], and $x_{30}$ within partition 224 lower location [+5]. In other words, no relative symbol shifting is needed to load the code symbol R2 symbols $x_{26}$, $x_{27}$, $x_{28}$, $x_{29}$, and $x_{30}$ into section 114 of subarray 110A. Similarly, the C2 symbols $x_{26}$, $x_{27}$, $x_{28}$, $x_{29}$, and $x_{30}$ are loaded from the buffer to respective shift registers that positions symbol $x_{26}$ within partition 226 lower location [−1], $x_{27}$ within partition 220 lower location [−2], $x_{28}$ within partition 222 lower location [−3], $x_{29}$ within partition 224 lower location [−4], and $x_{30}$ within partition 226 lower location [−5]. In other words, the relative logical order of the code symbol C2 symbols $x_{26}$, $x_{27}$, $x_{28}$, $x_{29}$, and $x_{30}$ are reversed by the shift registers for loading into section 112 of subarray 110A.

Even further, the 110A portion of the R3/C3 code symbol is locally stored in the buffer and includes symbols $x_{36}$, $x_{37}$, $x_{38}$, and $x_{39}$ to be stored in subarray 110A. The R3 symbols are loaded from the buffer to respective shift registers that positions the R2 symbols $x_{36}$, $x_{37}$, $x_{38}$, and $x_{39}$ for loading into section 114 of subarray 110A. Likewise, the C3 symbols $x_{36}$, $x_{37}$, $x_{38}$, and $x_{39}$ are loaded from the buffer to respective shift registers that shift the relative positions of the C2 symbols $x_{36}$, $x_{37}$, $x_{38}$, and $x_{39}$ for loading into section 112 of subarray 110A.

As shown in FIG. 11 at a subsequent clock cycle, the symbols within partition structure 220 locations 220[+1], 220[+2], and 220[+3] are moved to upper vertical stack partition structure 220 locations of similar horizontal position. Similarly, symbols within partition structure 222 locations 222[−1], 222[+1], and 222[+2] are moved to upper vertical stack partition structure 222 locations of similar horizontal position, symbols within partition structure 224 locations 224[−2], 224[−1], and 224[+1] are moved to upper vertical stack partition structure 224 locations of similar horizontal position, and symbols within partition structure 226 locations 226[−3], 226[−2], and 226[−1] are moved to upper vertical stack partition structure 226 locations of similar horizontal position. For example, symbols $x_0$, $x_1$, and $x_2$, are moved to upper vertical stack partition structure 220 locations, symbols $x_0$, $x_{14}$, and $x_{15}$, are moved to upper vertical stack partition structure 222 locations, symbols $x_1$, $x_{14}$, and $x_{26}$, are moved to upper vertical stack partition structure 224 locations, and symbols $x_2$, $x_{15}$, and $x_{26}$, are moved to upper vertical stack partition structure 226 locations.

Simultaneous to the symbol movement to the upper vertical stack locations, the 110A portions of the R5/C5, R6/C6, and R7/C7 code symbols are loaded into array 100. Specifically, the 110A portion of the R5/C5 code symbol locally stored in the buffer that includes symbols $x_{44}$, $x_{45}$, and $x_{46}$ are stored in subarray 110A. The R5 code symbol portion of symbols is loaded from the buffer to respective shift registers that positions symbol $x_{44}$ within partition 220 lower location [+1], $x_{45}$ within partition 220 lower location [+2], and $x_{46}$ within partition 220 lower location [+3]. In other words, no relative symbol shifting is needed to load the code symbol R5 symbols $x_{44}$, $x_{45}$, and $x_{46}$ into section 114 of subarray 110A. Similarly, the C5 symbols $x_{44}$, $x_{45}$, and $x_{46}$ are loaded from the buffer to respective shift registers that positions symbol $x_{44}$ within partition 222 lower location [−1], $x_{45}$ within partition 224 lower location [−2], and $x_{46}$ within partition 226 lower location [−3]. In other words, the relative logical order of the code symbol C5 symbols $x_{44}$, $x_{45}$, and $x_{46}$ are reversed by the shift registers for loading into section 112 of subarray 110A.

Further, the 110A portion of the R6/C6 code symbol locally stored in the buffer that includes symbols $x_{50}$ and $x_{51}$ are stored in subarray 110A. The R6 code symbol portion of symbols is loaded from the buffer to respective shift registers that positions symbol $x_{50}$ within partition 222 lower location [+1] and $x_{51}$ within partition 222 lower location [+2]. In other words, no relative symbol shifting is needed to load the code symbol R6 symbols $x_{50}$ and $x_{51}$ into section 114 of subarray 110A. Similarly, the C6 symbols $x_{50}$ and $x_{51}$ are loaded from the buffer to respective shift registers that positions symbol $x_{50}$ within partition 224 lower location [−1] and $x_{51}$ within partition 226 lower location [−2]. In other words, the relative logical order of the code symbol C6 symbols $x_{50}$ and $x_{51}$ are reversed by the shift registers for loading into section 112 of subarray 110A. Upon the subsequent movement of symbols to upper vertical stack partition locations and further symbol loading, the 110A portions of code symbols R0-R3 and C0-C3 are at least partially positioned along diagonals or antidiagonal, respectively.

Figure 12A:
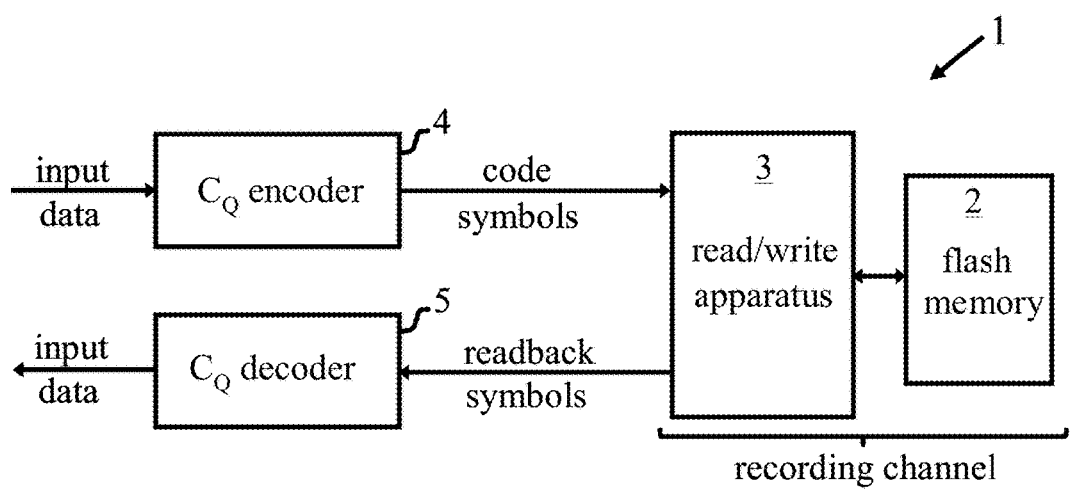
FIG. 12A is a schematic representation of data storage apparatus embodying the invention.

FIG. 12A is a schematic block diagram of one embodiment of data storage apparatus for reading and writing ECC encoded data on a storage medium, in this case flash memory. The storage device 1 includes a recording channel containing flash memory 2 and a read/write mechanism comprising apparatus 3 for reading and writing data in memory 2. Though shown as a single block in the figure, flash memory 2 may comprise any desired configuration of flash storage units ranging, for example, from a single chip or die to a plurality of storage banks each containing multiple packages of storage chips. Read/write apparatus 3 performs read and write operations in known manner, addressing individual memory cells for read and write purposes by applying appropriate voltages to an array of word and bit lines in memory 2. Device 1 further includes a data encoder 4 and a date decoder 5. The encoder 4 encodes input user data into code symbols in accordance with a quarter product code, and outputs the code symbols to the recording channel. The data decoder 5 processes the readback symbols from read/write apparatus 4 to decode the quarter product code and so recover the original input data.

In general, functionality of encoder 4 and decoder 5 could be implemented in hardware or software or a combination thereof. For example, the encoding/decoding operation could be performed in whole or in part by software which configures a computer to perform the operations described. For reasons of operating speed, however, the use of hard-wired logic circuits is generally preferred to implement functionality as far as possible. Suitable hardware and software implementations will be apparent to those skilled in the art from the description herein.

Figure 12B:
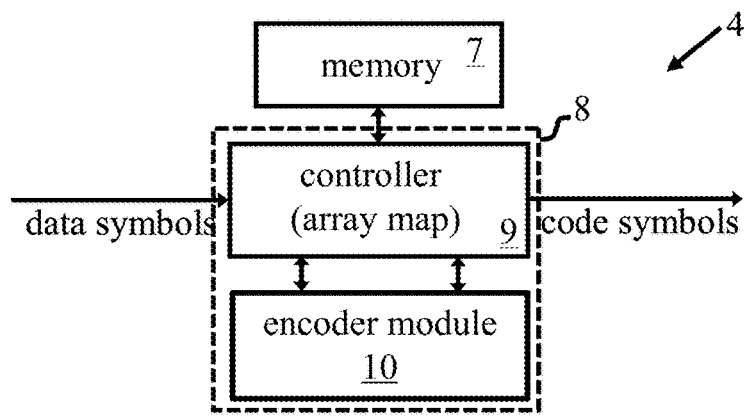
FIG. 12B is a schematic block diagram of a code word encoder and decoder, according to various embodiments of the present invention.

FIG. 12B is a more detailed schematic of the encoder 4. The encoder comprises memory 7 for storing input data symbols and code symbols generated in operation of the encoder, and encoder logic 8. The encoder logic includes a controller 9 for controlling storage and retrieval of symbols in memory 7 in accordance with an array map defined in the encoder logic. The array map defines a mapping between physical storage locations (symbol addresses) in memory 7 and locations in structure 100 as described below. Encoder logic 8 also includes an encoder module 10 for encoding R code symbols and encoding C symbols.

Encoder 4 operates on successive groups of input data symbols, encoding each group in accordance with quarter product code to produce code symbols for output to the recording channel. The input data symbols are stored in memory 7 by controller 9, and are thereby loaded to respective symbol locations. The assignment of input data symbols to the structure 100 (together with additional symbols assigned to array locations as described below) serves to define a plurality of code symbols in the structure 100. Under control of controller 9, symbols are supplied from memory 7 to R encoder 13 and C encoder 11 which perform the R and C encoding. The resulting code symbols are stored in memory 7 at addresses which map to the appropriate array 100 locations as explained below.

Figure 13:
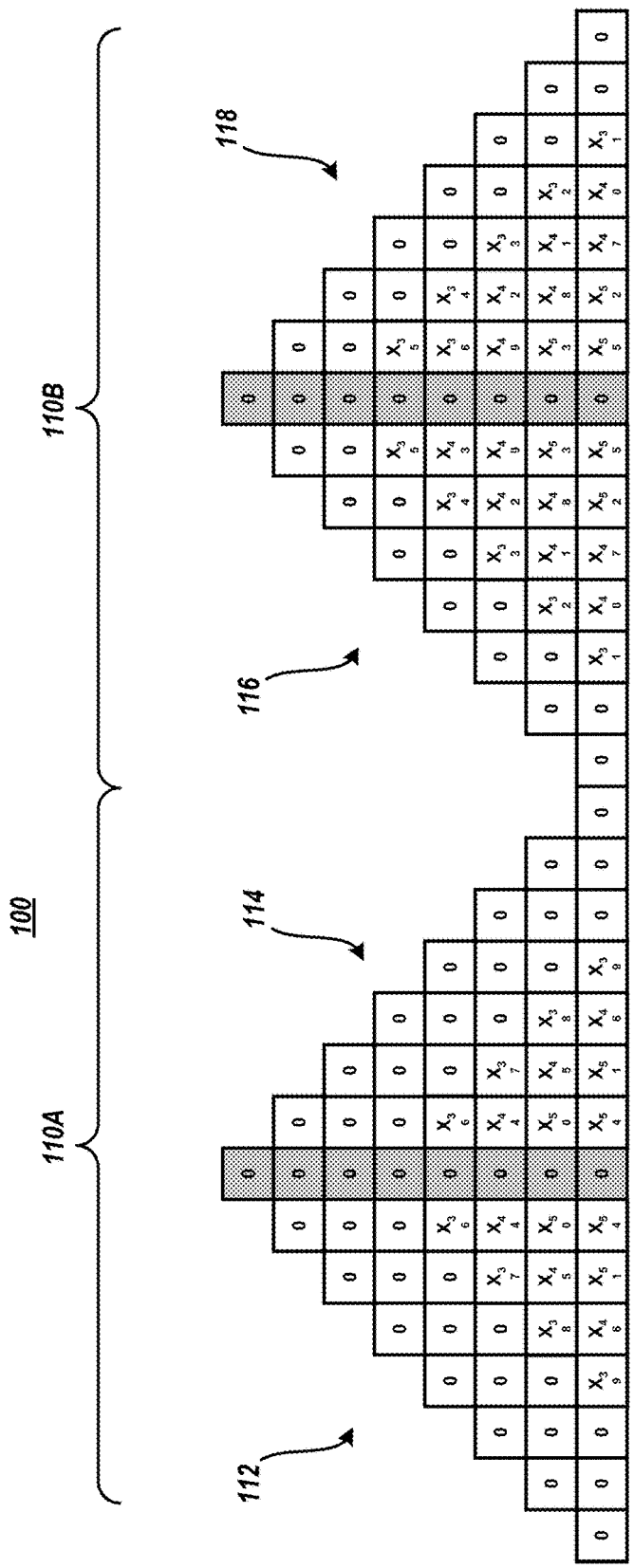
FIG. 13-FIG. 19 depict exemplary encoding stages, according to various embodiments of the present invention.

FIG. 13 depicts an exemplary initial encoding stage wherein user data and parity zeros are loaded into structure 100. In embodiments, code symbols R0-R7 are encoded, P at a time if parallelism is implemented, by reading R0-R7 portions, encoding, and loading R0-R7 parity to the back to structure 100. In embodiments, subsequent to R0-R7 encoding, code symbols C0-C7 are encoded, P at a time if parallelism is implanted, by reading C0-C7 portions, encoding, and loading C0-C7 parity back to structure 100.

Figure 14A:
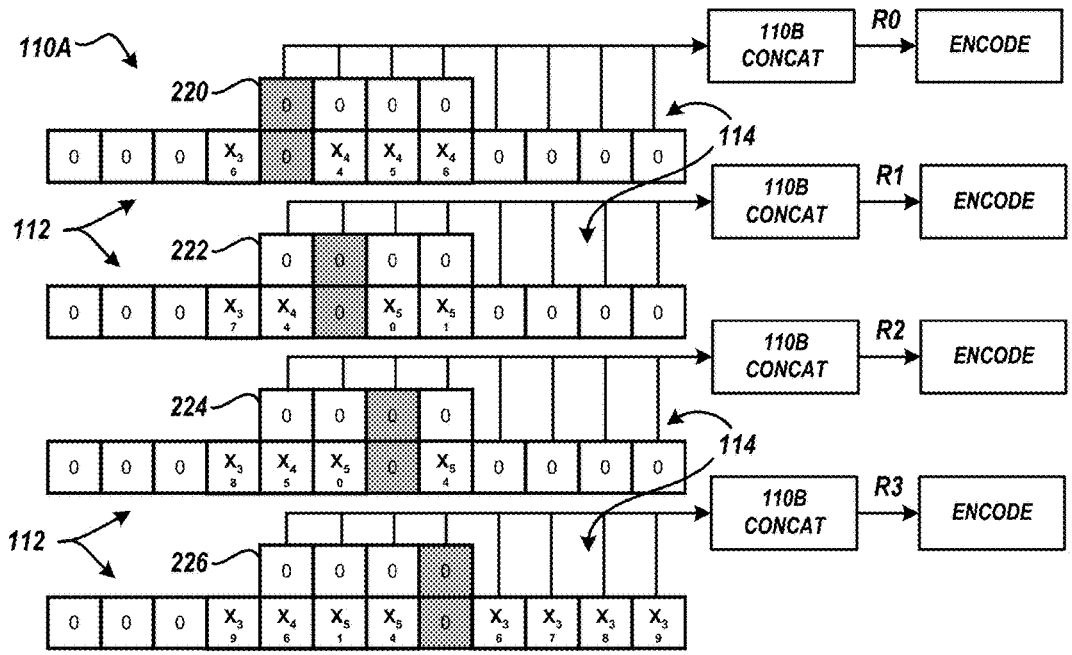
Figure 14B:
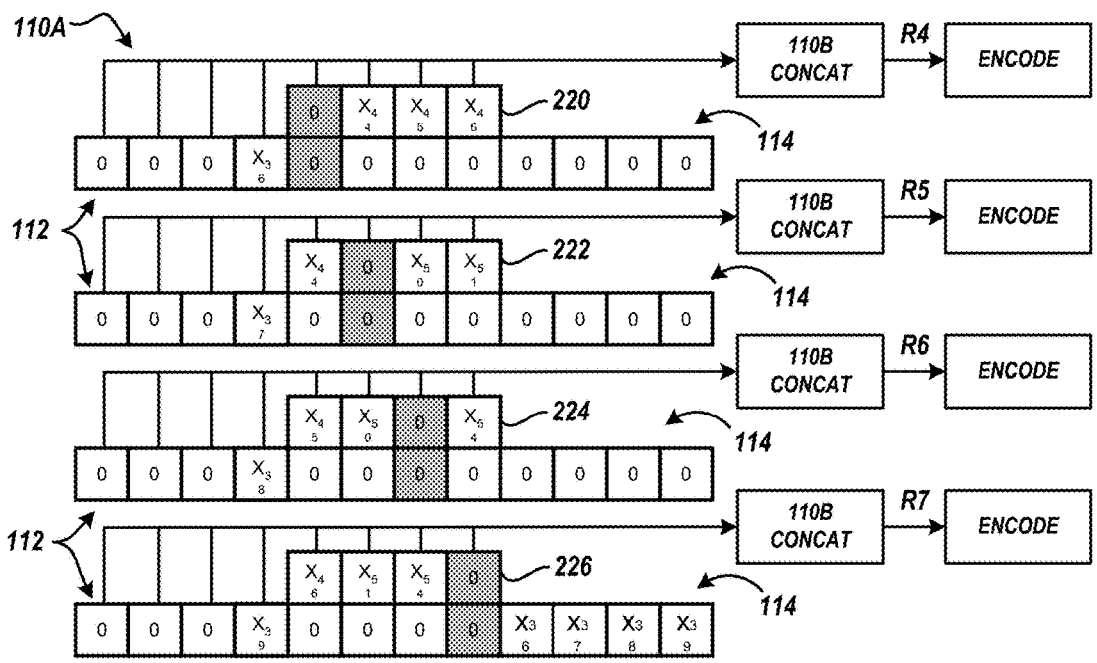

FIG. 14A depicts an encoding stage at an initial clock cycle wherein the 110A portion of code symbol R0-R3 are accessed in parallel, concatenated with the 110B portion of code symbol R0-R3, and encoded. FIG. 14B depicts an encoding stage at a subsequent clock cycle wherein the 110A portion of code symbol R4-R7 are accessed in parallel, concatenated with the respective 110B portions of code symbol R4-R7, and encoded. For instance, associated code symbols may be read from upper vertical stack partition structure locations of structure section 114 of subarray 110A and from structure section 116 of subarray 110B, concatenated, and encoded. In embodiments, the portions of code symbols R0-R3 that are read from upper stack partition locations are also written back to associated lower stack partition locations sifting affected symbols to the upper stack partition locations such that the portions of code symbols R4-R7 may be subsequently read. For example, as shown in FIG. 14A, the 110A portion of code symbol R3 is read from partition 226 upper stack locations and includes symbols 0, 0, 0, 0, $x_{36}$, $x_{37}$, $x_{38}$, and $x_{39}$. As shown in FIG. 14B, the 110A portion of code symbol R3 is written to corresponding partition 226 lower stack locations effectively moving symbols $x_{46}$, $x_{51}$, and $x_{54}$ to the upper vertical stack locations allowing the 110A portion of code symbol R7 to be read from 226 upper stack locations.

Figure 15A:
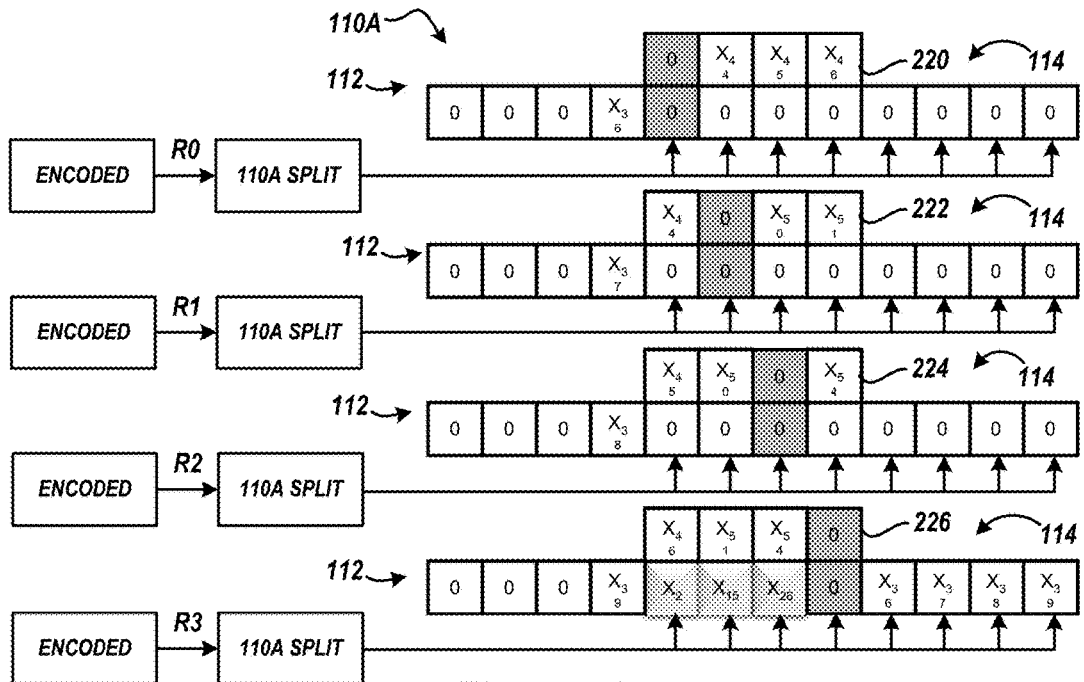
Figure 15B:
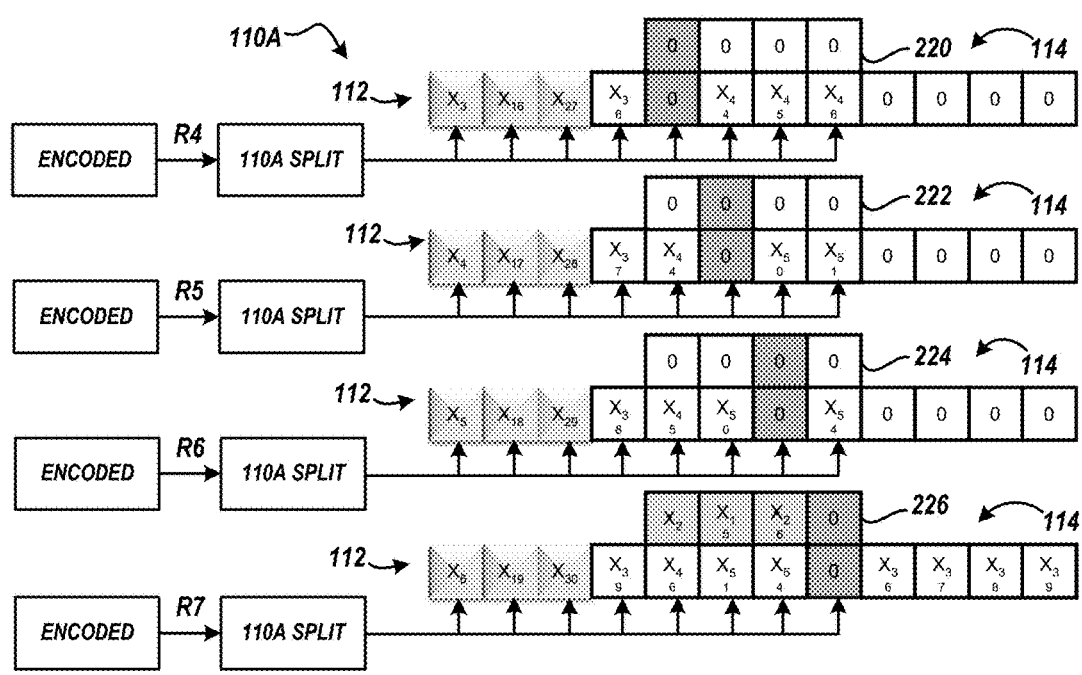
Figure 16:
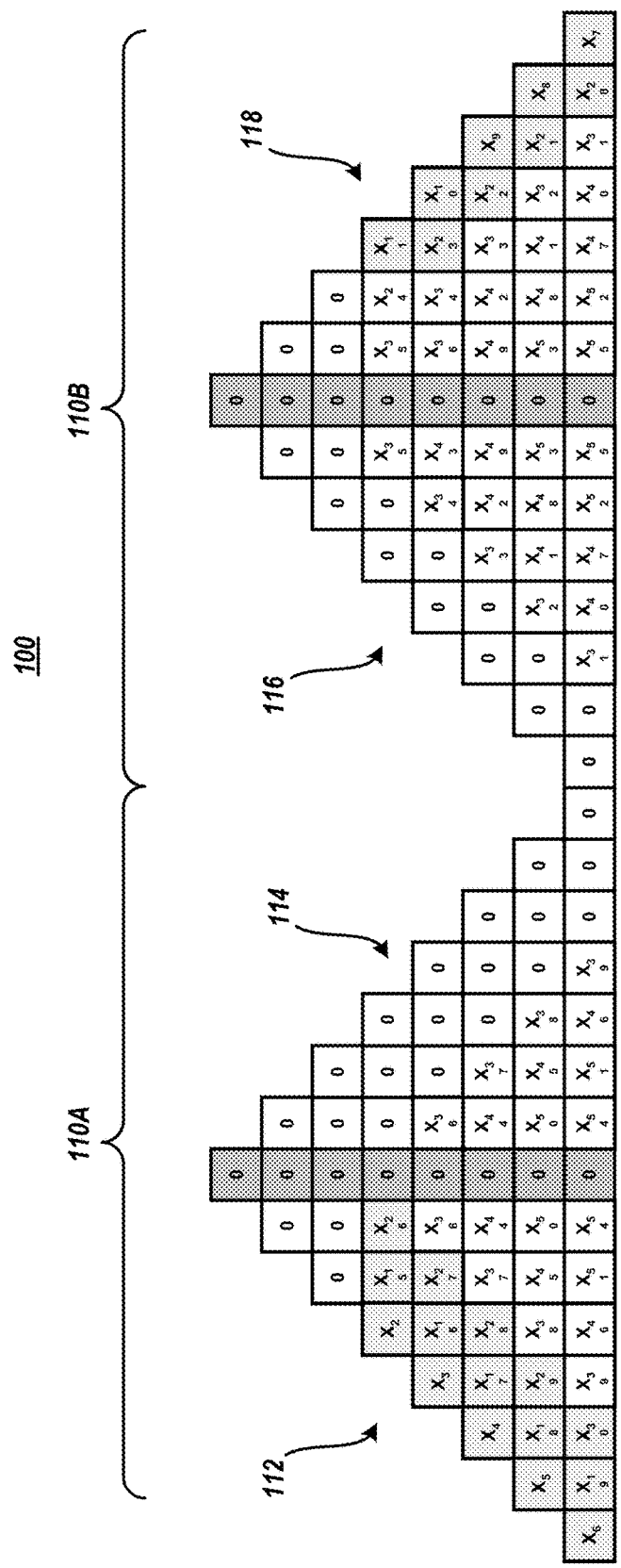

As shown in FIG. 15A and FIG. 15B, the encoded code symbol portions are written to back to structure 100. As shown in FIG. 15A, the encoded code symbol portions R0-R3 are written to respective sections of subarray 110A. In embodiments, parity symbols generated by the encoder are written to the subarray. For example, parity symbols $x_2$, $x_{15}$, $x_{26}$ generated by the encoder are included in the 110A portion of code symbol R3 and are written to section 112 of subarray 110A. As shown in FIG. 15B, the encoded code symbol portions R4-R7 are written to respective sections of subarray 110A. In embodiments, parity symbols generated by the encoder are included within the encoded code symbol portions are written to opposing portions of subarray. For example, parity symbols $x_3$, $x_{15}$, $x_{27}$ generated by the encoder are included in the 110A portion of code symbol R4 and are written to section 112 of subarray 110A. Similarly, parity symbols $x_6$, $x_{19}$, $x_{30}$ generated by the encoder are included in the 110A portion of code symbol R7 and are written to section 112 of subarray 110A. A similar technique may be utilized to read and encode portions of code symbols R0-R7 from subarray 110B to write the encoded portions of code symbols R0-R7 to subarray 110B. Structure 100 is shown subsequent to code symbol R0-R7 encoding in FIG. 16 wherein the encoded R0-R7 symbols along with parity symbols are written to structure 100.

Figure 17A:
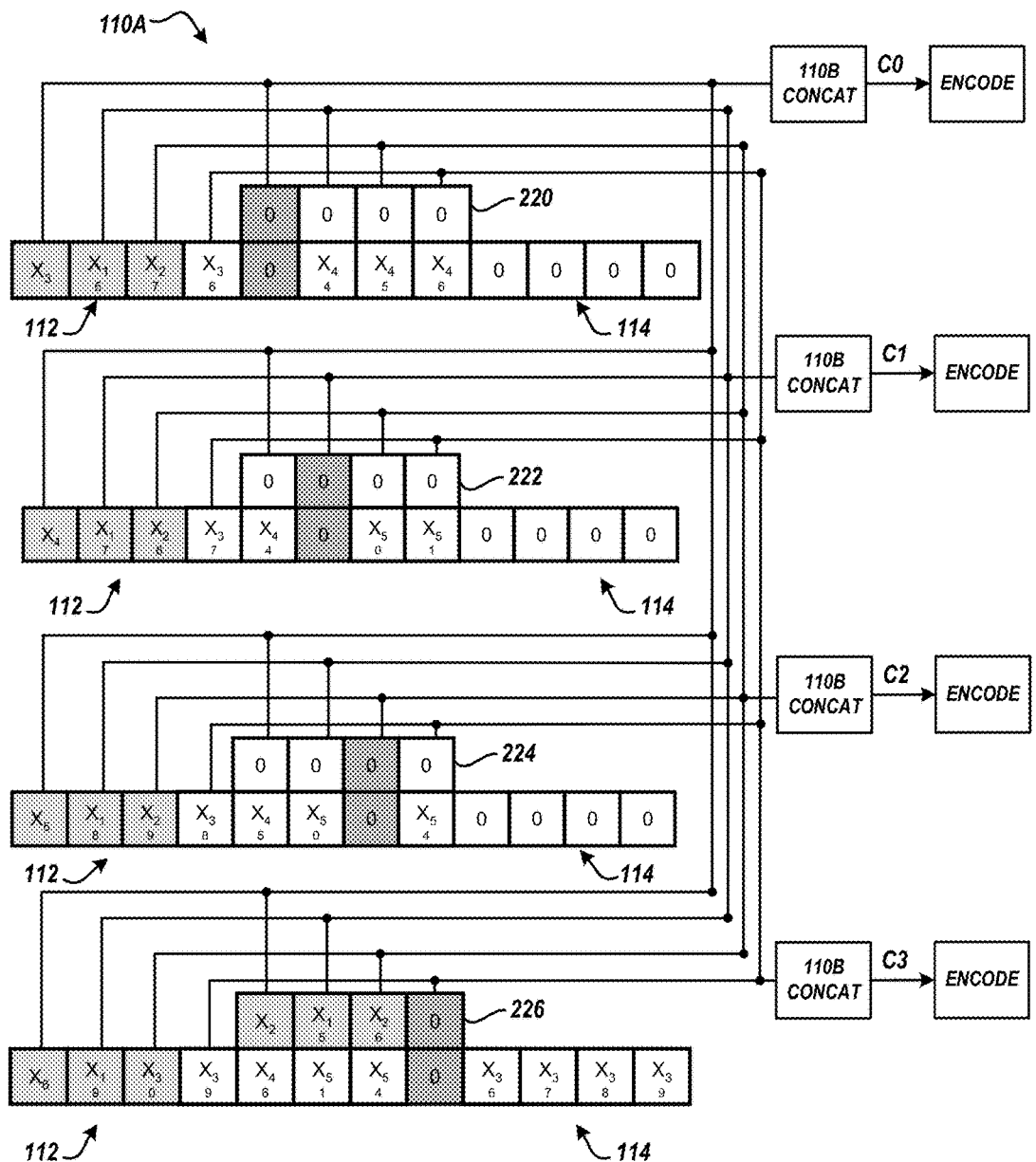
Figure 17B:
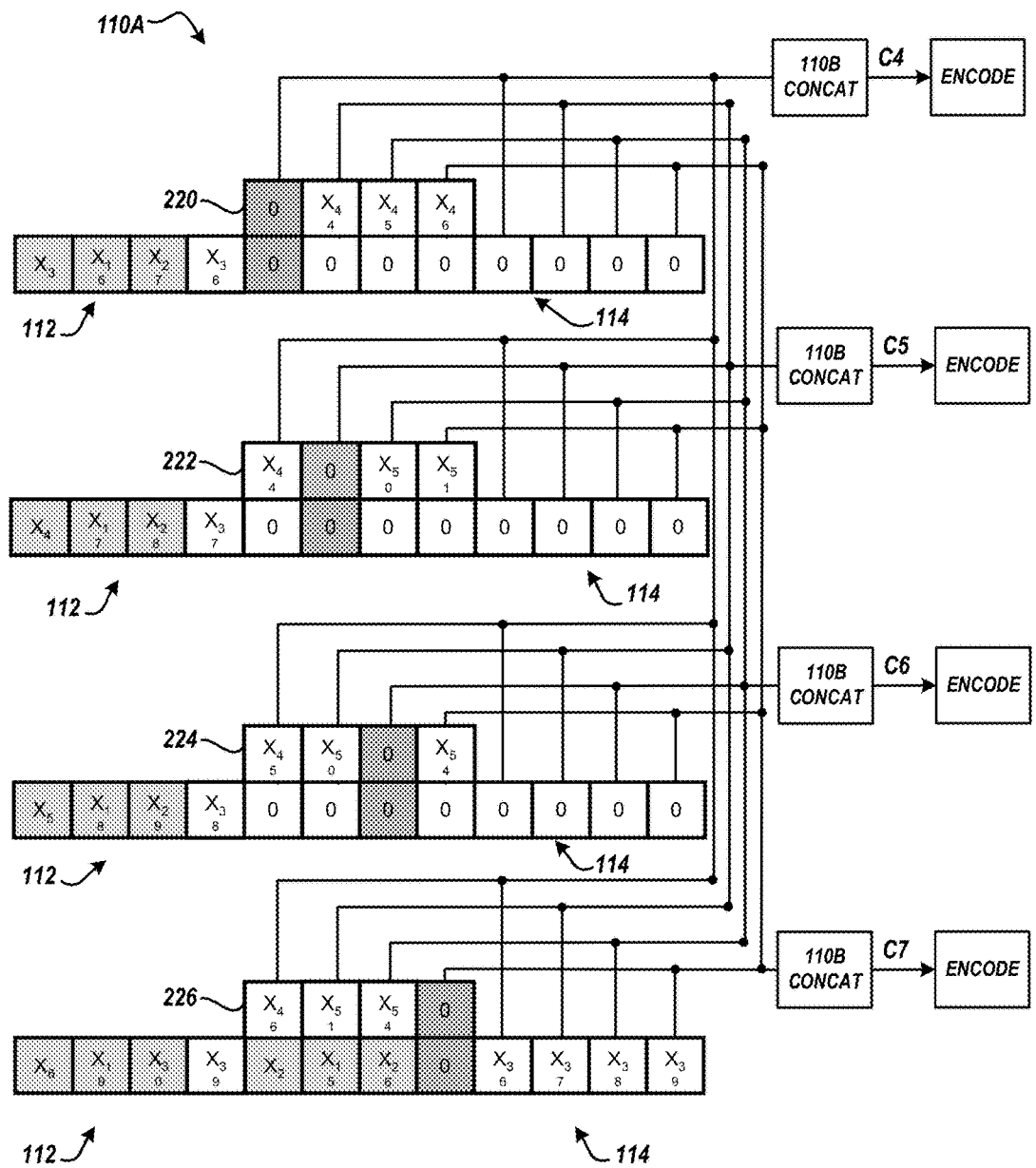

FIG. 17A depicts an encoding stage at a clock cycle wherein the 110A portion of code symbol C0-C3 are accessed in parallel, concatenated with the 110B portion of code symbol C0-C3, and encoded. FIG. 17B depicts an encoding stage at a subsequent clock cycle wherein the 110A portion of code symbol C4-C7 are accessed in parallel, concatenated with the respective 110B portions of code symbol C4-C7, and encoded. For instance, associated code symbols may be read from upper vertical stack partition structure locations of subarray 110A and from upper vertical stack partition structure locations of subarray 110B, concatenated, and encoded. In embodiments, the portions of code symbols C0-C3 that are read in parallel from upper stack partition locations are locally written back to associated lower stack partition locations sifting affected symbols to the upper stack partition locations such that the portions of code symbols C4-C7 may be subsequently read in parallel. For example, as shown in FIG. 17B, symbols are read from partition upper stack locations and written to corresponding partition lower stack locations effectively shifting e.g., symbols $x_{44}$, $x_{45}$, and $x_{46}$, to corresponding partition 220 upper stack locations, symbols $x_{44}$, $x_{50}$, and $x_{54}$, to corresponding partition 222 upper stack locations, symbols $x_{45}$, $x_{50}$, and $x_{54}$, to corresponding partition 224 upper stack locations, and symbols $x_{46}$, $x_{51}$, and $x_{54}$, to corresponding partition 226 upper stack locations.

Figure 18A:
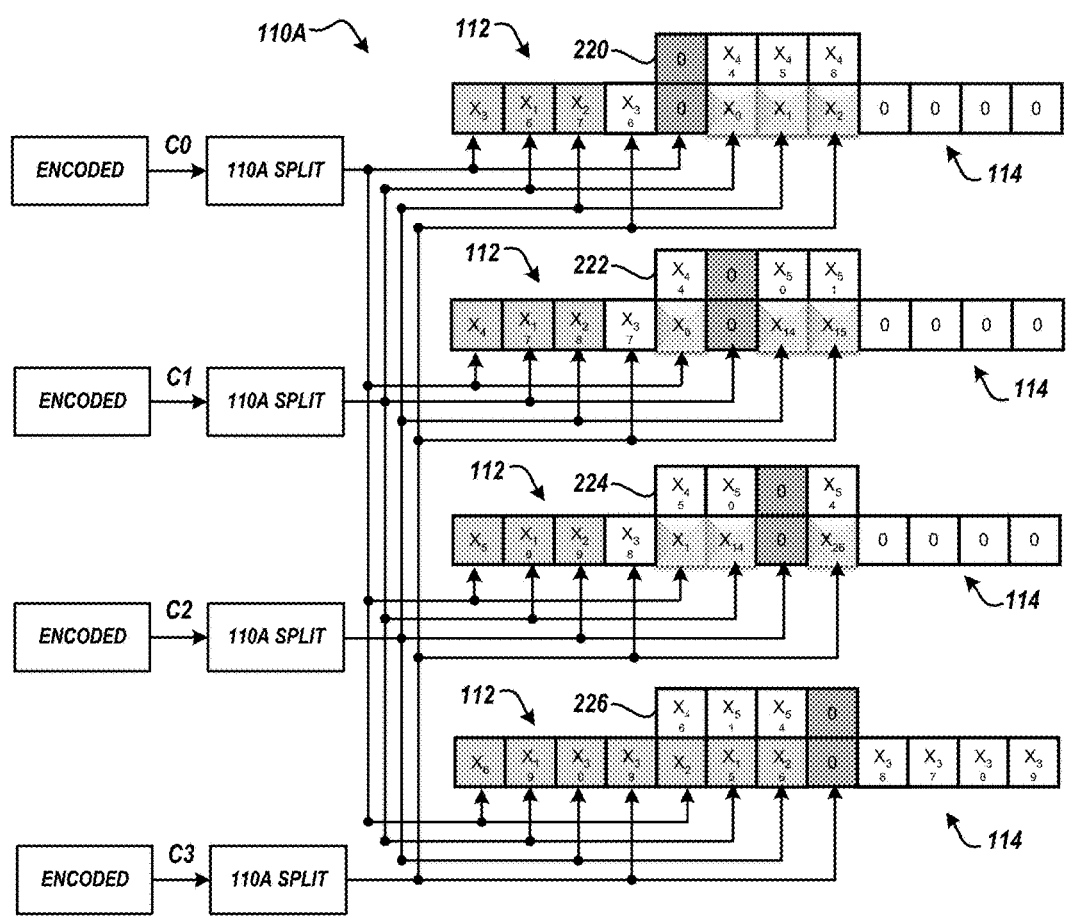
Figure 18B:
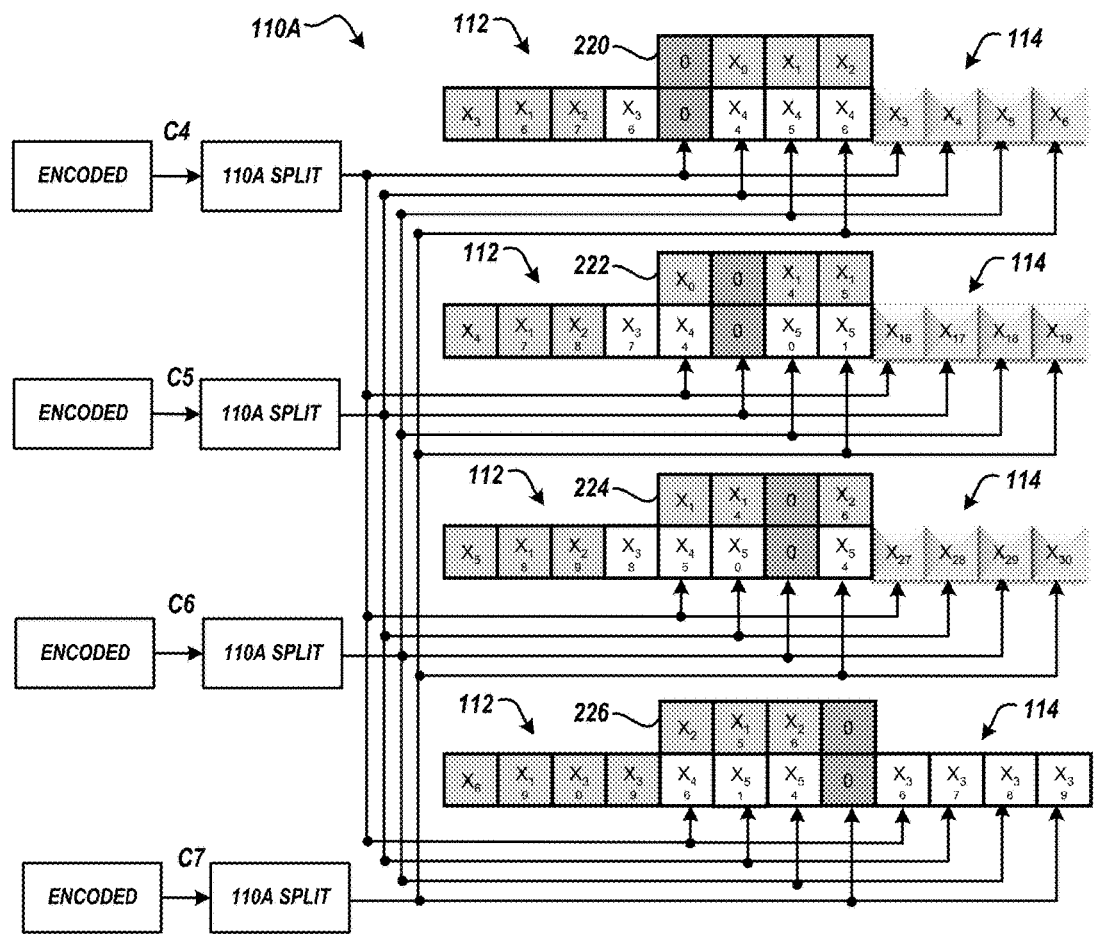

As shown in FIG. 18A and FIG. 18B, the encoded code symbol portions are written to respective subarray portions. As shown in FIG. 18A, the encoded code symbol portions C0-C3 are written to subarray 110A. In embodiments, parity symbols generated by the encoder are included within the encoded code symbol portions are also written to the subarray. For example, parity symbols $x_0$, $x_1$, $x_2$ generated by the encoder are included in the 110A portion of code symbol C1-C3, respectively, are written to section 114 of subarray 110A. Similarly, parity symbols $x_0$, $x_{14}$, and $x_{15}$ located in partition 222 that were generated by the encoder are included in the 110A portion of code symbols C0, C2, and C3 are written to section 112 and section 114 respectively, of subarray 110A. Further, parity symbols $x_1$, $x_{14}$, and $x_{26}$ located in partition 224 that were generated by the encoder are included in the 110A portion of code symbols C0, C1, and C3 are written to sections 112 and 114 respectively of subarray 110A. A similar technique may be utilized to read and encode portions of code symbols C4-C7 from subarray 110B and to write the encoded portions of code symbols C4-C7 to subarray 110B as shown in FIG. 18B. Structure 100 is shown, subsequent to code symbol C0-C7 encoding, in FIG. 19 wherein shaded parity symbols, generated by the encoder by reading and encoding section 112 and 118 symbols, are written to sections 114 and 116, respectively.

Figure 19:
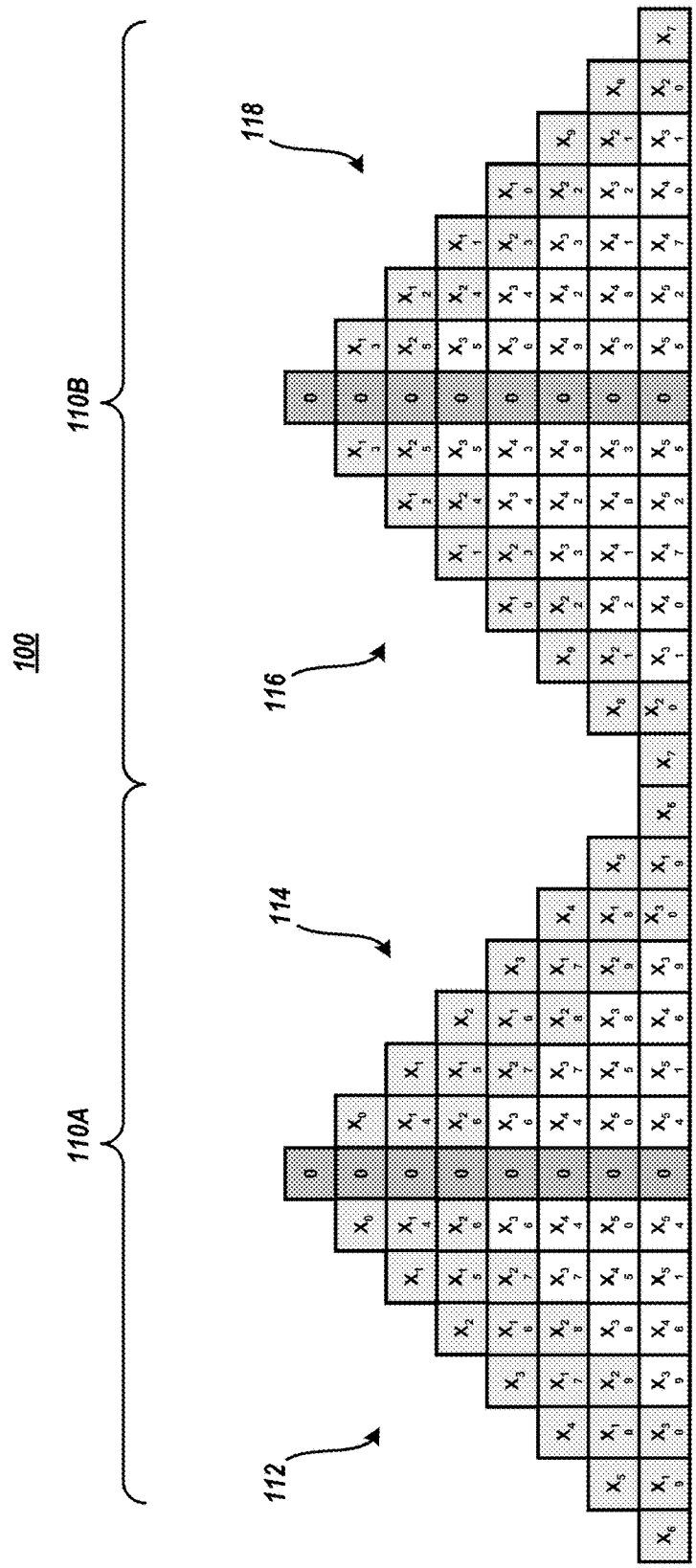

FIG. 19 may additionally depict an exemplary initial decoding stage wherein symbols are loaded into structure 100. In embodiments, code symbols R0-R7 are decoded, P at a time if parallelism is implemented, by reading R0-R7 portions from subarray 100A, decoding, and loading R0-R7 corrections to subarray 100A and reading R0-R7 portions from subarray 100B, decoding, and loading R0-R7 corrections subarray 100B. In embodiments, subsequent to R0-R7 decoding, code symbols C0-C7 are decoded, P at a time if parallelism is implemented, by reading C0-C7 portions from subarray 100A, decoding, and loading C0-C7 corrections to subarray 100A and reading C0-C7 portions from subarray 100B, decoding, and loading C0-C7 corrections to subarray 100B.

Figure 20A:
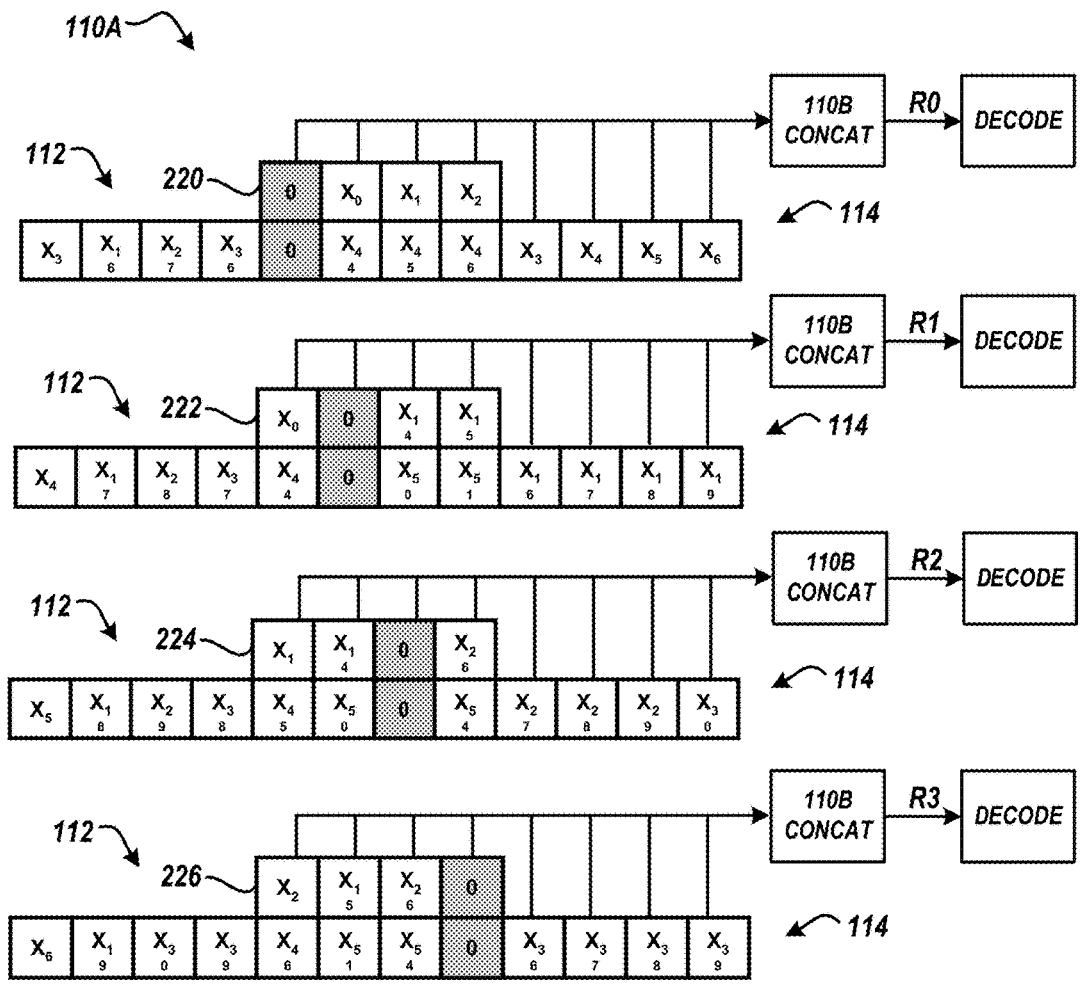
FIG. 20A-FIG. 23B depict exemplary decoding stages, according to various embodiments of the present invention.
Figure 20B:
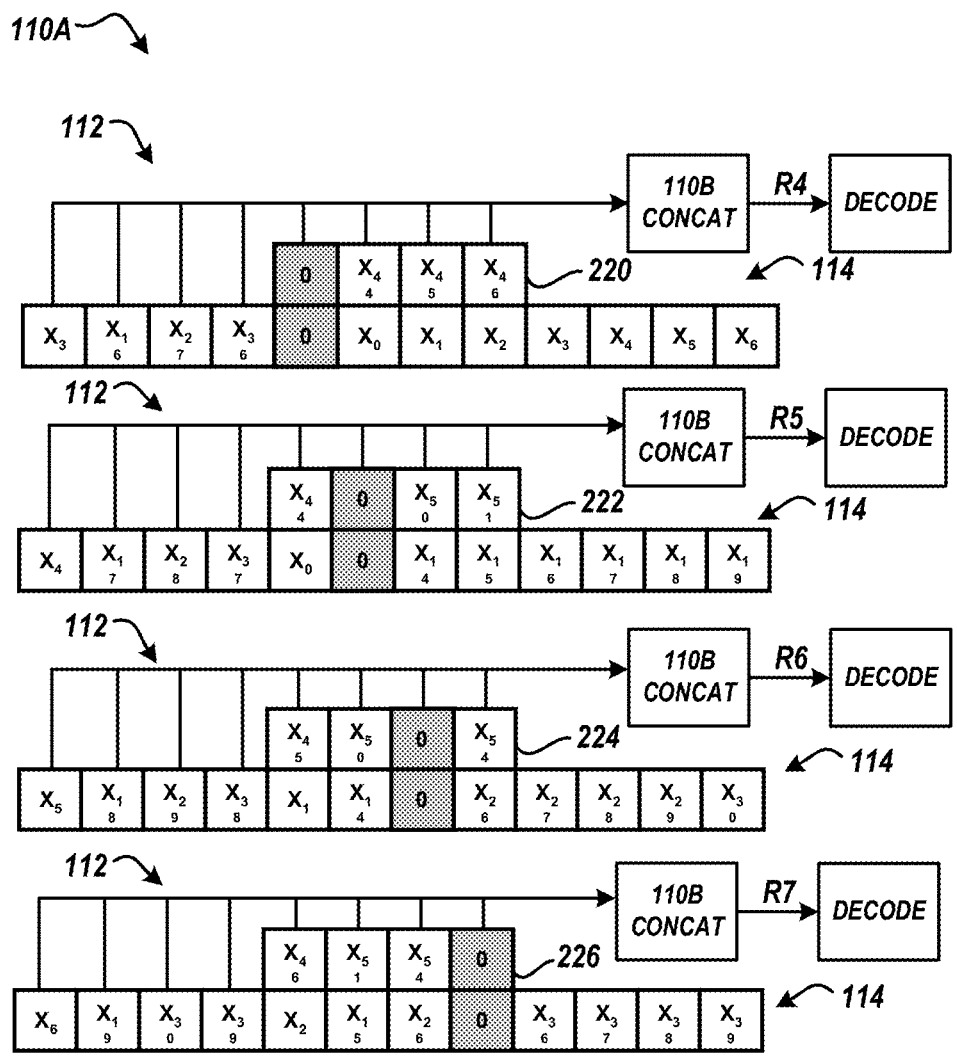

FIG. 20A depicts an decoding stage at an initial clock cycle wherein the 110A portion of code symbol R0-R3 are accessed in parallel, concatenated with the 110B portion of code symbol R0-R3, and decoded. FIG. 20B depicts an encoding stage at a subsequent clock cycle wherein the 110A portion of code symbol R4-R7 are accessed in parallel, concatenated with the respective 110B portions of code symbol R4-R7, and decoded. In embodiments, the portions of code symbols R0-R3 read in parallel from upper stack partition locations are locally written back to associated lower stack partition locations sifting affected symbols to the upper stack partition locations such that the portions of code symbols R4-R7 may be subsequently read in parallel. For example, the relative position of symbols $x_0$, $x_1$, and $x_2$ are rotated with symbols $x_{44}$, $x_{45}$, and $x_{46}$ within partition 220, the relative position of symbols $x_0$, $x_{14}$, and $x_{15}$ are rotated with symbols $x_{44}$, $x_{50}$, and $x_{51}$ within partition 222, the relative position of symbols $x_0$, $x_{14}$, and $x_{26}$ are rotated with symbols $x_{45}$, $x_{50}$, and $x_{54}$ within partition 224, and the relative position of symbols $x_2$, $x_{15}$, and $x_{26}$ are rotated with symbols $x_{46}$, $x_{51}$, and $x_{54}$ within partition 226.

Figure 21A:
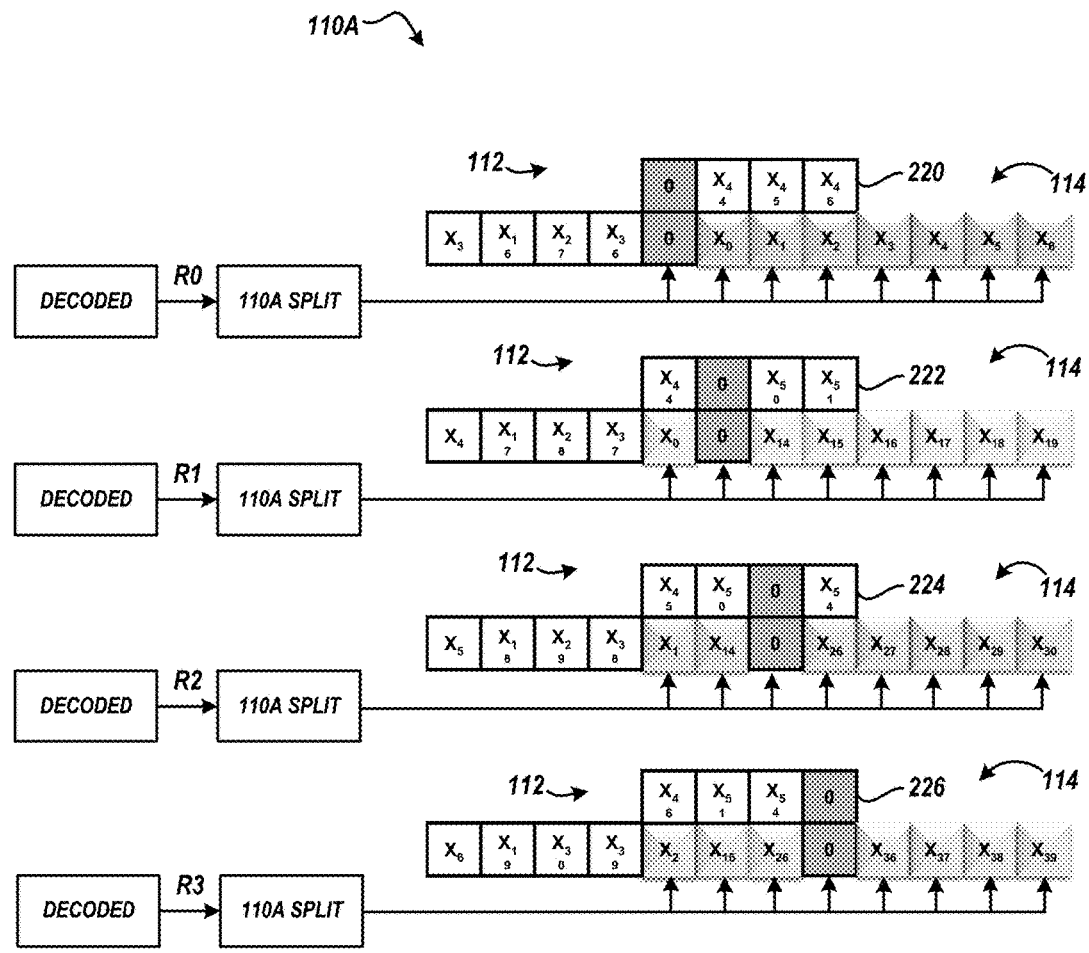
Figure 21B:
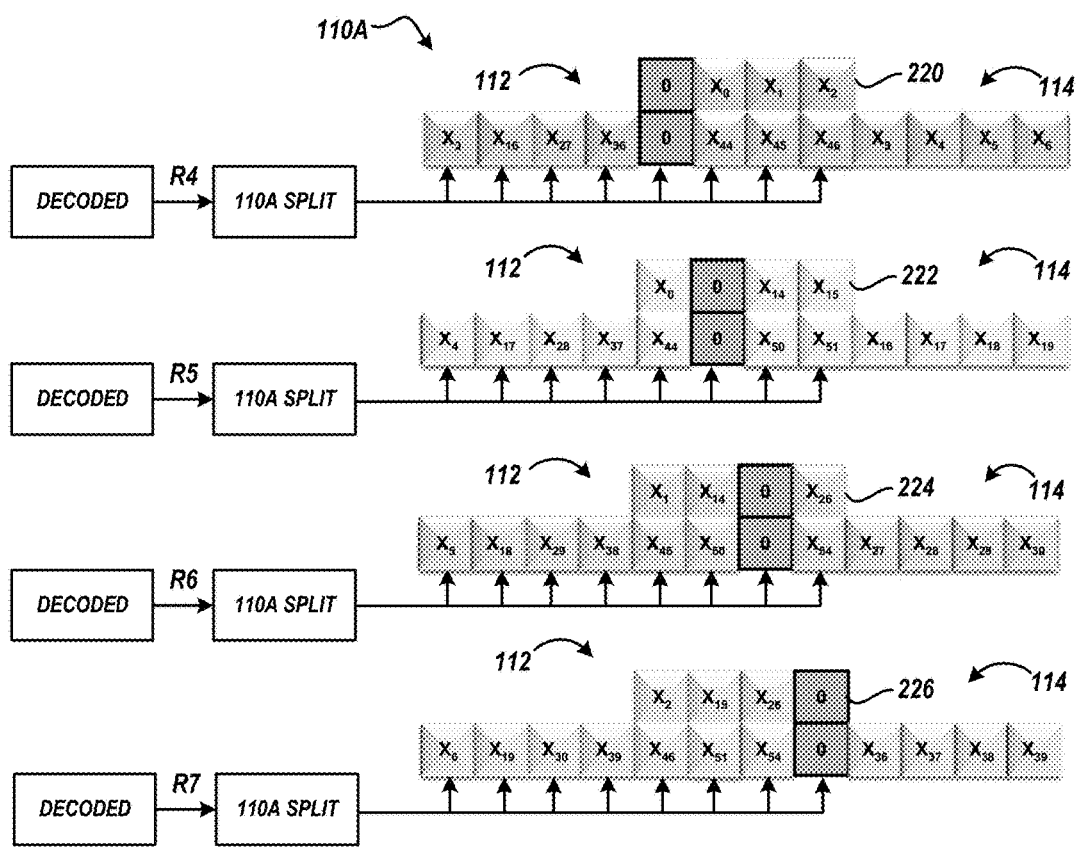

FIG. 21A and FIG. 21B, depicts the decoded R0-R7 code symbol portions written to opposing subarray portions. As shown in FIG. 21A, the decoded code symbol portions R0-R3 are written to section 112 of subarray 110A. In embodiments, corrected symbols generated by the decoder are included within the decoded code symbol portions are written to structure 100. For example, corrected symbols $x_0$, $x_1$, $x_2$ $x_3$, $x_4$, $x_5$ and $x_6$, generated by the decoder are written to section 114 within partition 220 of subarray 110A, corrected symbol $x_0$ generated by the decoder are written to section 112 within partition 222 of subarray 110A and corrected symbols $x_{14}$, $x_{15}$ $x_{16}$, $x_{17}$, $x_{18}$ and $x_{19}$, generated by the decoder are written to portions 114 within partition 222 of subarray 110A. Similarly, corrected symbols $x_1$ and $x_{14}$ generated by the decoder are written to section 112 within partition 224 of subarray 110A and corrected symbols $x_{26}$, $x_{27}$, $x_{28}$, $x_{29}$, and $x_{30}$, generated by the decoder are written to portions 114 within partition 224 of subarray 110A. Likewise, corrected symbols $x_2$, $x_{15}$, and $x_{26}$ generated by the decoder are written to section 112 within partition 226 of subarray 110A and corrected symbols $x_{36}$, $x_{37}$, $x_{38}$, and $x_{39}$, generated by the decoder are written to portions 114 within partition 226 of subarray 110A.

As shown in FIG. 21B, the decoded code symbol portions R4-R7 are written 110A. In embodiments, corrected symbols generated by the decoder are written to opposing portions of subarray. For example, corrected symbols $x_3$, $x_{16}$, $x_{27}$, and $x_{36}$ generated by the decoder are written to section 112 within partition 220 of subarray 110A and corrected symbols $x_{44}$, $x_{45}$, and $x_{46}$ generated by the decoder are written to section 114 within partition 220 of subarray 110A, effectively shifting symbols $x_0$, $x_1$, and $x_2$ to associated upper partition 220 stack locations. Similarly, corrected symbols $x_4$, $x_{17}$, $x_{28}$, $x_{37}$, and $x_{44}$ generated by the decoder are written to section 112 within partition 222 of subarray 110A and corrected symbols $x_{50}$ and $x_{51}$ generated by the decoder are written to section 114 within partition 220 of subarray 110A, effectively shifting symbols $x_0$, $x_{14}$, and $x_{15}$ to associated upper partition 222 stack locations. Further, corrected symbols $x_5$, $x_{18}$, $x_{29}$, $x_{38}$, $x_{345}$ and $x_{54}$ generated by the decoder are written to section 112 within partition 224 of subarray 110A and corrected symbol $x_{54}$ generated by the decoder is written to section 114 within partition 224 of subarray 110A, effectively shifting symbols $x_1$, $x_{14}$, and $x_{26}$ to associated upper partition 224 stack locations. Similarly, corrected symbols $x_6$, $x_{19}$, $x_{30}$, $x_{39}$, $x_{46}$, $x_{51}$ and $x_{54}$ generated by the decoder are written to section 112 within partition 226 of subarray 110A, effectively shifting symbols $x_2$, $x_{15}$, and $x_{26}$ to associated upper partition 226 stack locations.

Figure 22A:
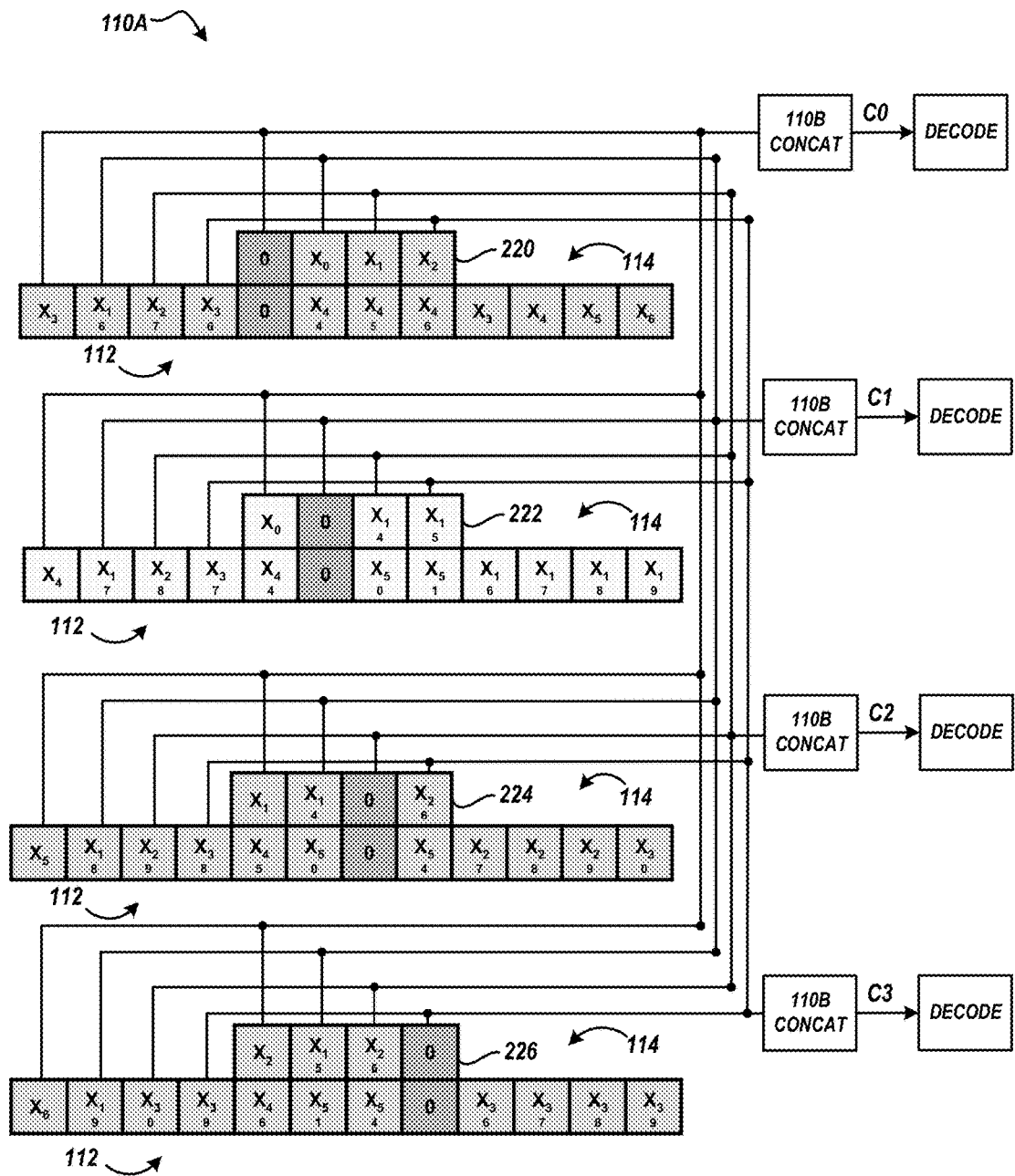
Figure 22B:
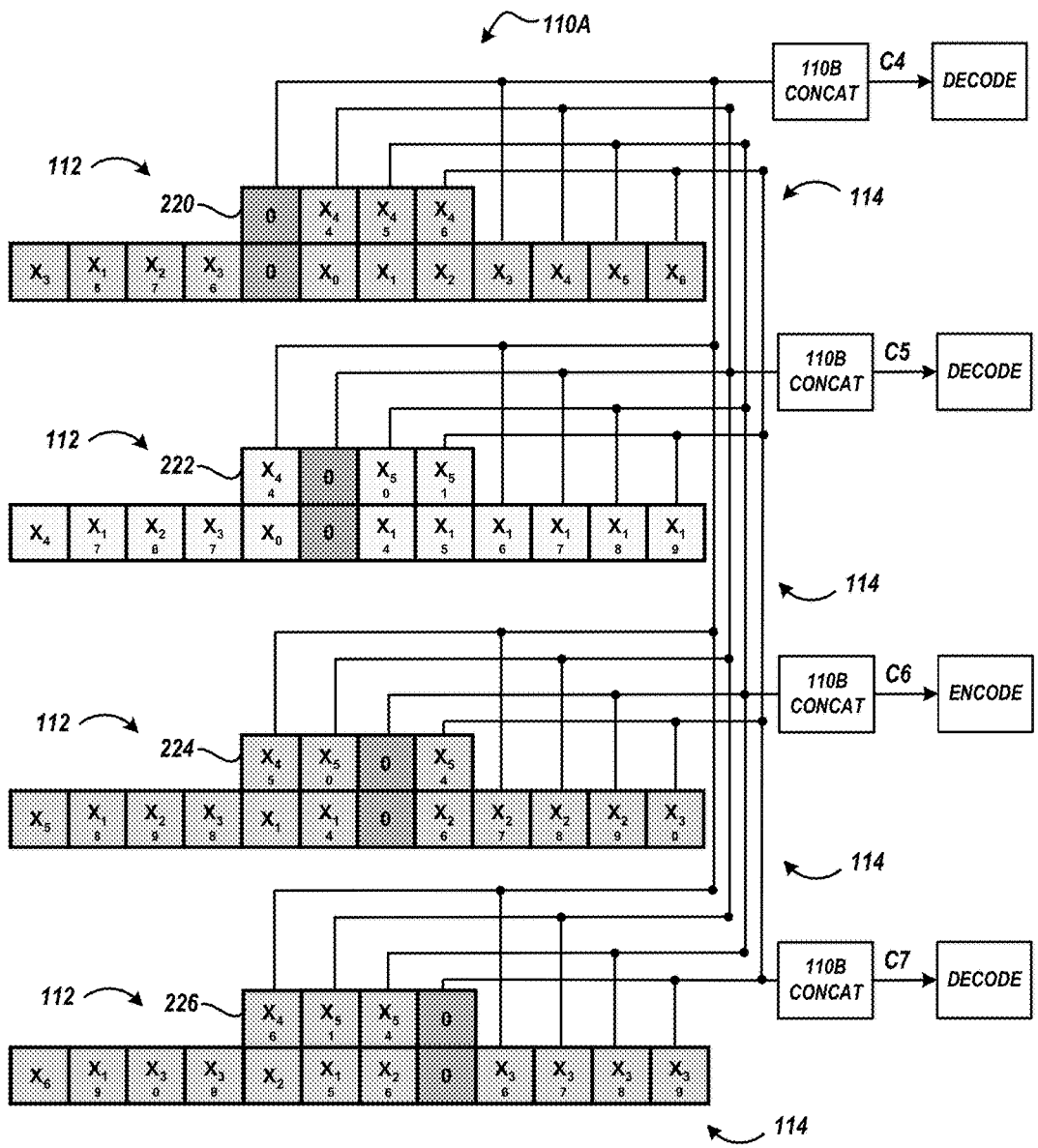

FIG. 22A depicts a decoding stage at a clock cycle wherein the 110A portion of code symbols C0-C3 are accessed in parallel, concatenated with the 110B portion of code symbols C0-C3, and decoded. FIG. 22B depicts a decoding stage at a subsequent clock cycle wherein the 110A portion of code symbols C4-C7 are accessed in parallel, concatenated with the respective 110B portions of code symbol C4-C7, and decoded. For instance, C0-C7 code symbols may be read from upper vertical stack partition structure locations of structure section 112 of subarray 110A and from structure section 116 of subarray 110B, concatenated, and encoded.

In embodiments, the portions of code symbols C0-C3 that are read in parallel from upper stack partition locations are locally written back to associated lower stack partition locations sifting affected symbols to the upper stack partition locations such that the portions of code symbols C4-C7 may be subsequently read in parallel. For example, as shown in FIG. 22B, symbols are read from partition upper stack locations and written to corresponding partition lower stack locations. For example, respective C0-C3 symbols $x_3$, $x_{16}$, $x_{27}$, $x_{36}$, $x_0$, $x_1$, and $x_2$ are decoded in parallel and subsequently written back to partition 220, effectively shifting relative positioning of symbols $x_0$, $x_1$, and $x_2$ with symbols $x_{44}$, $x_{45}$, and $x_{46}$ so that the portions of code symbols C4-C7 may be subsequently decoded in parallel. Similarly, respective C0-C3 symbols $x_4$, $x_{17}$, $x_{28}$, $x_{37}$, $x_0$, $x_{14}$, and $x_{15}$ are decoded in parallel and subsequently written back to partition 222, effectively shifting relative positioning of symbols $x_0$, $x_{14}$, and $x_{15}$ with symbols $x_{44}$, $x_{50}$, and $x_{51}$ so that the portions of code symbols C4-C7 may be subsequently decoded in parallel. Further, respective C0-C3 symbols $x_5$, $x_{18}$, $x_{29}$, $x_{38}$, $x_1$, $x_{14}$, and $x_{26}$ are decoded in parallel and subsequently written back to partition 224, effectively shifting relative positioning of symbols $x_1$, $x_{14}$, and $x_{26}$ with symbols $x_{44}$, $x_{50}$, and $x_{54}$ so that the portions of code symbols C4-C7 may be subsequently decoded in parallel. Likewise, respective C0-C3 symbols $x_6$, $x_{19}$, $x_{30}$, $x_{39}$, $x_2$, $x_{15}$, and $x_{26}$ are decoded in parallel and subsequently written back to partition 226, effectively shifting relative positioning of symbols $x_2$, $x_{15}$, and $x_{26}$ with symbols $x_{46}$, $x_{51}$, and $x_{54}$ so that the portions of code symbols C4-C7 may be subsequently decoded in parallel.

Figure 23A:
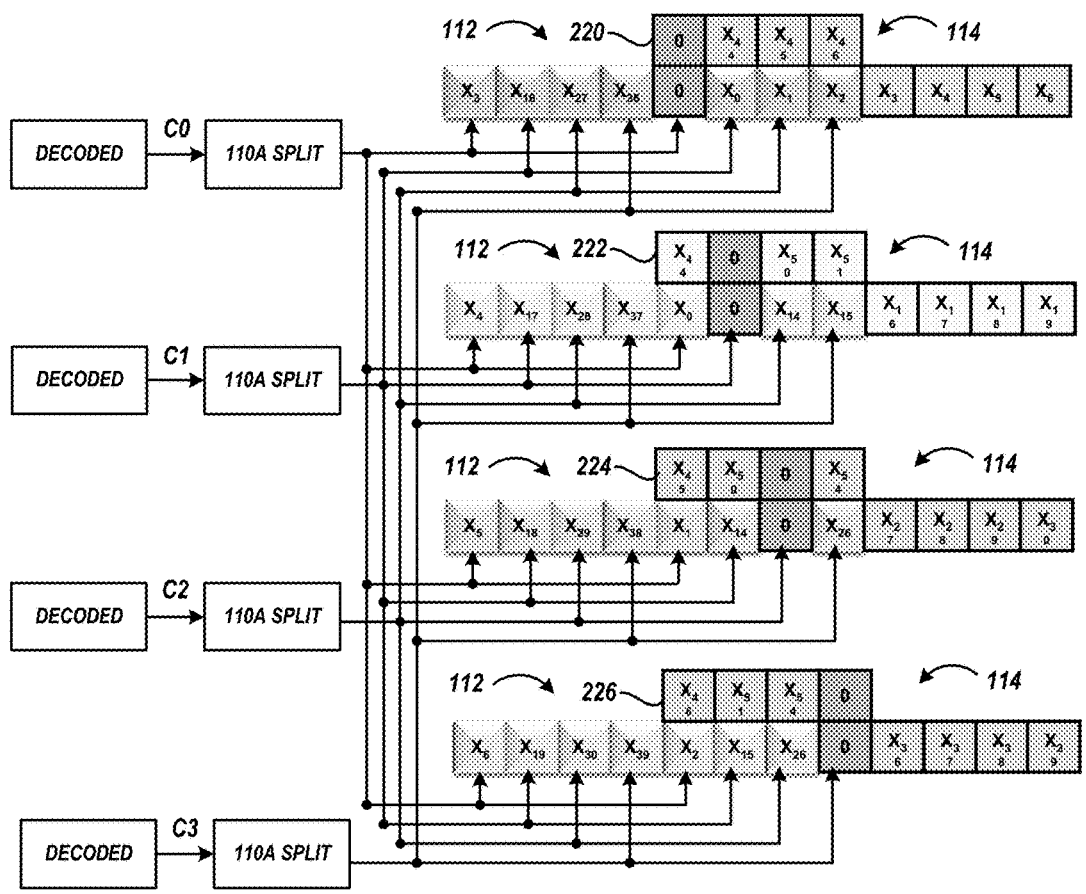
Figure 23B:
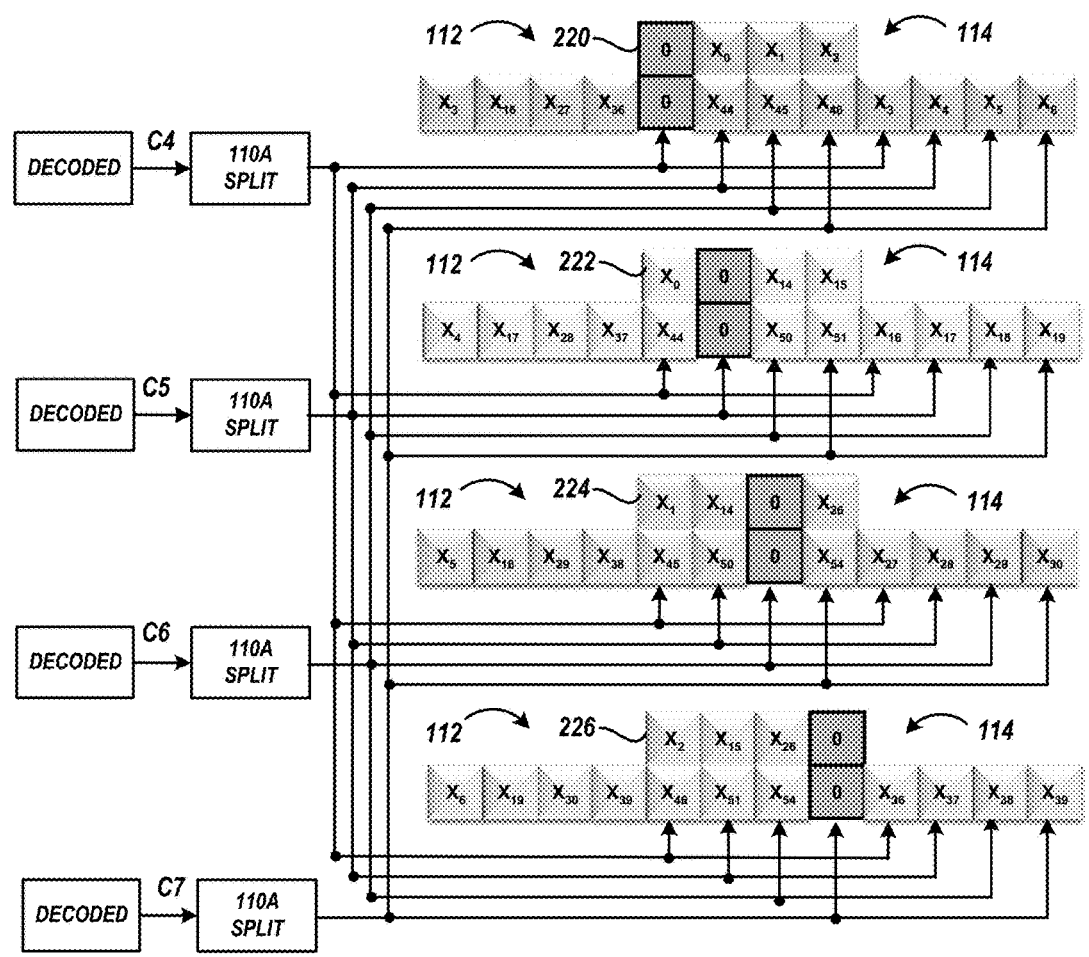

As shown in FIG. 23A and FIG. 23B, decoded code symbol C0-C7 portions are written to opposing subarray portions. As shown in FIG. 23A, the encoded code symbol C0-C3 are split into portions and the 110A portion is written to subarray 110A. In embodiments, corrected symbols generated by the decoder are included within the decoded code symbol portions and are written to the subarray. For example, corrected symbols $x_3$, $x_{16}$, $x_{27}$, and $x_{36}$ generated by the decoder are included in respective 110A portions of code symbols C0-C3 and are written to partition 220 within section 112 of subarray 110A and corrected symbols $x_0$, $x_1$, and $x_2$ generated by the decoder are included in respective 110A portions of code symbols C1-C3 and are written to partition 220 within section 114 of subarray 110A. Similarly, corrected symbols $x_4$, $x_{17}$, $x_{28}$, $x_{37}$, and $x_0$ generated by the decoder are included in respective 110A portions of code symbols C0-C3 and are written to partition 222 within section 112 of subarray 110A and corrected symbols $x_{14}$ and $x_{15}$ generated by the decoder are included in respective 110A portions of code symbols C2 and C3 and are written to partition 222 within section 114 of subarray 110A. Further, corrected symbols $x_5$, $x_{18}$, $x_{29}$, $x_{38}$, $x_1$, and $x_{14}$ generated by the decoder are included in respective 110A portions of code symbols C0-C3 and are written to partition 224 within section 112 of subarray 110A and corrected symbol $x_{26}$ generated by the decoder is included in respective 110A portion of code symbol C3 and is written to partition 224 within section 114 of subarray 110A. Likewise, corrected symbols $x_6$, $x_{19}$, $x_{30}$, $x_{39}$, $x_2$, $x_{15}$ and $x_{26}$ generated by the decoder are included in respective 110A portions of code symbols C0-C3 and are written to partition 226 within section 112 of subarray 110A.

As shown in FIG. 23B, the encoded code symbol C4-C4 are split into portions and the 110A portion is written to subarray 110A, the 110B portion is written to subarray 110B, etc. In embodiments, corrected symbols generated by the decoder are included within the decoded code symbol portions and are written to the subarray. For example, corrected symbols $x_{44}$, $x_{45}$, $x_{46}$, $x_3$, $x_4$, $x_5$, and $x_6$ generated by the decoder are included in respective 110A portions of code symbols C4-C7 and are written to partition 220 within section 114 of subarray 110A. In association with the writing of symbols $x_{44}$, $x_{45}$, and $x_{46}$, corrected symbols $x_0$, $x_1$, and $x_2$ are shifted to partition 220 relative upper stack positions. Similarly, corrected symbol $x_{44}$ generated by the decoder is included in respective 110A portions of code symbol C4 and is written to partition 222 within section 112 of subarray 110A and corrected symbols $x_{50}$, $x_{51}$, $x_{16}$, $x_{17}$, $x_{18}$, and $x_{19}$ generated by the decoder are included in respective 110A portion of code symbols C4-C7 and are written to partition 222 within section 114 of subarray 110A. In association with the writing of symbols $x_{44}$, $x_{50}$, and $x_{51}$, corrected symbols $x_0$, $x_{14}$, and $x_{15}$ are shifted to partition 222 relative upper stack positions. Further, corrected symbols $x_{45}$ and $x_{50}$ generated by the decoder are included in respective 110A portions of code symbol C4 and C5 and are written to partition 224 within section 112 of subarray 110A and corrected symbols $x_{54}$, $x_{27}$, $x_{28}$, $x_{29}$, and $x_{30}$ generated by the decoder are included in respective 110A portion of code symbols C4-C7 and are written to partition 224 within section 114 of subarray 110A. In association with the writing of symbols $x_{45}$, $x_{50}$, and $x_{54}$, corrected symbols $x_1$, $x_{14}$, and $x_{26}$ are shifted to partition 224 relative upper stack positions. Likewise, corrected symbols $x_{46}$, $x_{51}$, and $x_{54}$ generated by the decoder are included in respective 110A portions of code symbol C4-C6 and are written to partition 226 within section 112 of subarray 110A and corrected symbols $x_{36}$, $x_{37}$, $x_{38}$, and $x_{39}$ generated by the decoder are included in respective 110A portion of code symbols C4-C7 and are written to partition 226 within section 114 of subarray 110A. In association with the writing of symbols $x_{46}$, $x_{51}$, and $x_{54}$, corrected symbols $x_2$, $x_{15}$, and $x_{26}$ are shifted to partition 226 relative upper stack positions.

Similar techniques may be utilized to write decoded portions of code symbols C0-C7 to subarray 110B.

Figure 24:
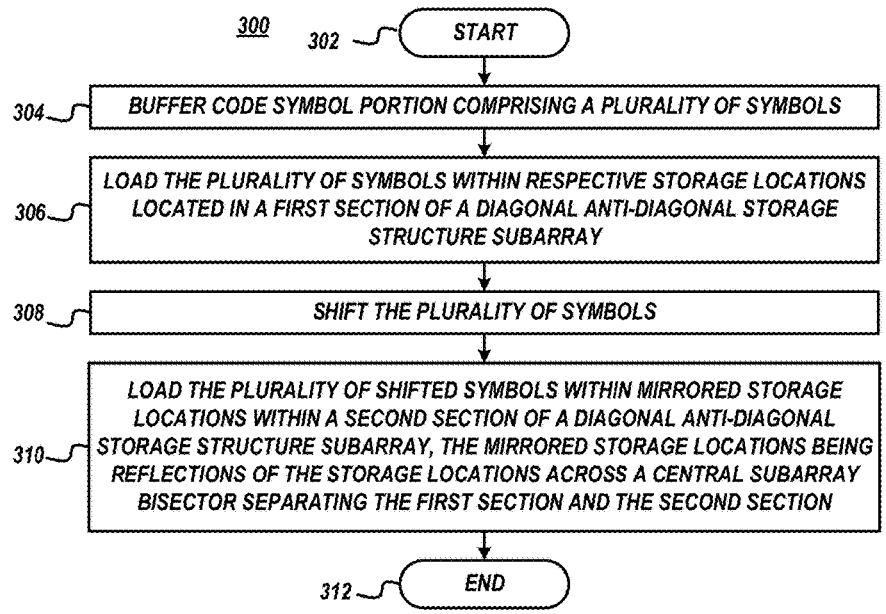
FIG. 24 depicts a method for loading symbols to a diagonal anti-diagonal structure, according to various embodiments of the present invention.

FIG. 24 depicts an exemplary block diagram of a method 300 of loading data to a diagonal anti-diagonal storage structure, according to various embodiments of the present invention. In various embodiments method 300 may be configured as a logic module, etc invoked by e.g., a processor. Method 300 begins at block 302 and continues with buffering, loading, or otherwise storing a code symbol portion comprising a plurality of symbols into a buffer or memory (block 304).

Method 300 may continue with loading the plurality of symbols within respective storage locations in a first section of the diagonal anti-diagonal storage structure (block 306). For example, as shown in FIG. 7, code symbols $x_2$, $x_{15}$, and $x_{26}$ may be loaded within section 112 of portion 110A of structure 100. Method 300 may continue with respective shift registers shifting the symbols (block 308) and loading the shifted symbols within mirrored storage locations within a second section of the storage structure, the mirrored storage locations being reflections of the storage locations across a central bisector separating the first section from the second section (block 310). For example, code symbols $x_2$, $x_{15}$, and $x_{26}$ are logically reversed and are loaded within section 114 of portion 110A of structure 100. The reversed code symbols $x_2$, $x_{15}$, and $x_{26}$ within section 114 are mirrored with respect to code symbols $x_2$, $x_{15}$, and $x_{26}$ within section 112 across a central zero bisector that separates section 112 from section 114 within portion 110A. Method 300 ends at block 312.

Figure 25:
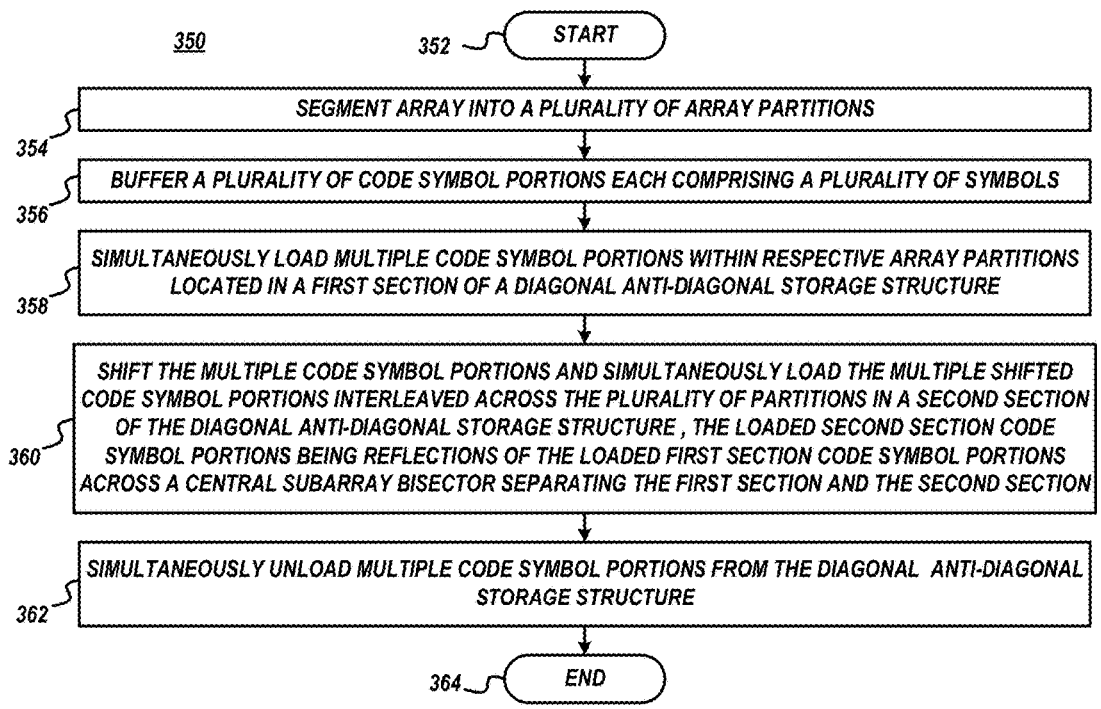
FIG. 25 depicts a method for simultaneously accessing a diagonal anti-diagonal structure, according to various embodiments of the present invention.

FIG. 25 depicts an exemplary block diagram of a method 350 of simultaneously loading data to a diagonal anti-diagonal storage array, according to various embodiments of the present invention. In various embodiments method 350 may be configured as a logic module, etc invoked by e.g., a processor. Method 350 begins at block 352 and continues with segmenting the diagonal anti-diagonal storage array into partitions (block 354). For example, the diagonal anti-diagonal storage array may be segmented into P partition structures where P is the number of the number of code symbols loaded or unloaded simultaneously. If four code symbols are to be read or written simultaneously, the diagonal anti-diagonal storage array may be partitioned into partitions 220, 222, 224, and 226. The partitions may be generally delineated so that P R code symbols and P C code symbols can be read in a single clock cycle.

Method 350 may continue by buffering, loading, or otherwise storing multiple code symbol portions each comprising a plurality of symbols into a buffer or memory (block 356). For example, a code symbol portion including symbols $x_0$, $x_1$, $x_2$, $x_3$, $x_4$, $x_5$, and $x_6$, a code symbol portion including symbols $x_{14}$, $x_{15}$, $x_{16}$, $x_{17}$, $x_{15}$, and $x_{19}$, code symbol portion including symbols $x_{26}$, $x_{27}$, $x_{28}$, $x_{29}$, and $x_{30}$ and code symbol portion including symbols $x_{36}$, $x_{37}$, $x_{38}$, and $x_{39}$ are stored in buffer 280.

Method 350 may continue with simultaneously loading from the buffer to the diagonal anti-diagonal storage structure multiple code symbol portions within respective array partitions located in a first section of the diagonal anti-diagonal storage structure (block 358). For example, as shown in FIG. 10, the portion of symbols $x_0$, $x_1$, $x_2$, $x_3$, $x_4$, $x_5$, and $x_6$ is loaded from the buffer to respective shift registers that positions symbol $x_0$ within partition 220 lower location [+1], $x_1$ within partition 220 lower location [+2], $x_2$ within partition 220 lower location [+3], $x_3$ within partition 220 lower location [+4], $x_4$ within partition 220 lower location [+5], $x_5$ within partition 220 lower location [+6], and $x_6$ within partition 220 lower location [+7]. Simultaneously, symbols $x_{14}$, $x_{15}$, $x_{16}$, $x_{17}$, $x_{18}$, and $x_{19}$ are loaded from the buffer to respective shift registers that positions $x_{14}$ within partition 222 lower location [+1], $x_{15}$ within partition 222 lower location [+2], $x_{16}$ within partition 222 lower location [+3], $x_{17}$ within partition 222 lower location [+4], $x_{18}$ within partition 222 lower location [+5], and $x_{19}$ within partition 222 lower location [+6]. Simultaneously, symbols $x_{26}$, $x_{27}$, $x_{28}$, $x_{29}$, and $x_{30}$ are loaded from the buffer to respective shift registers that positions $x_{26}$ within partition 224 lower location [+1], $x_{27}$ within partition 224 lower location [+2], $x_{28}$ within partition 224 lower location [+3], $x_{29}$ within partition 224 lower location [+4], and $x_{30}$ within partition 224 lower location [+5]. Likewise, symbols $x_{36}$, $x_{37}$, $x_{38}$, and $x_{39}$ are loaded from the buffer to respective shift registers that positions $x_{36}$ within partition 226 lower location [+1], $x_{37}$ within partition 226 lower location [+2], $x_{38}$ within partition 226 lower location [+3], and $x_{39}$ within partition 226 lower location [+4].

Method 350 may continue by simultaneously shifting and loading multiple shifted code symbol portions interleaved across the plurality of partitions in a second section of the diagonal anti-diagonal storage structure, the loaded second symbol portions being reflections of the loaded first section code symbols portions across a central subarray bisector separating the first section from the second section (block 360). For example, as shown in FIG. 10, the portion of symbols $x_0$, $x_1$, $x_2$, $x_3$, $x_4$, $x_5$, and $x_6$ is loaded from the buffer to respective shift registers that positions symbol $x_0$ within partition 222 lower location [−1], $x_1$ within partition 224 lower location [−2], $x_2$ within partition 226 lower location [−3], $x_3$ within partition 220 lower location [−4], $x_4$ within partition 222 lower location [−5], $x_5$ within partition 224 lower location [−6], and $x_6$ within partition 226 lower location [−7]. Simultaneously, symbols $x_{14}$, $x_{15}$, $x_{16}$, $x_{17}$, $x_{18}$, and $x_{19}$ are loaded from the buffer to respective shift registers that positions $x_{14}$ within partition 224 lower location [−1], $x_{15}$ within partition 226 lower location [−2], $x_{16}$ within partition 220 lower location [−3], $x_{17}$ within partition 222 lower location [−4], $x_{18}$ within partition 224 lower location [−5], and $x_{19}$ within partition 226 lower location Simultaneously, symbols $x_{26}$, $x_{27}$, $x_{28}$, $x_{29}$, and $x_{30}$ are loaded from the buffer to respective shift registers that positions $x_{26}$ within partition 226 lower location [−1], $x_{27}$ within partition 220 lower location [−2], $x_{28}$ within partition 222 lower location [−3], $x_{29}$ within partition 224 lower location [−4], and $x_{30}$ within partition 226 lower location [−5]. Likewise, symbols $x_{36}$, $x_{37}$, $x_{38}$, and $x_{39}$ are loaded from the buffer to respective shift registers that positions $x_{36}$ within partition 220 lower location [−1], $x_{37}$ within partition 222 lower location [−2], $x_{38}$ within partition 224 lower location [−3], and $x_{39}$ within partition 226 lower location [−4].

Subsequent to the simultaneous loading, the code symbol portions loaded in section 112 of portion 110A are mirrored with respect to the loaded code symbol portions loaded in section 114 of portion 110A against the zero subarray bisector. For example, as shown in FIG. 7, code symbols $x_2$, $x_{15}$, and $x_{26}$ are reversed and interleaved across partitions 224, 222, and 220 respectively within section 114 and are generally mirrored with respect to code symbols $x_2$, $x_{15}$, and $x_{26}$ within section 112 across a central zero bisector that separates section 112 from section 114 within portion 110A.

Method 350 may continue with simultaneously unloading multiple code symbol portions from the array along associated diagonals or anti-diagonals (block 362). For example, the R0 code symbol may be unloaded from the array by unloading the R0 code symbol portion of 110A by accessing path 130, unloading the R0 code symbol portion of 110B by accessing path 150, and concatenating the 110A and 110B portions. Simultaneous to the unloading of the R0 code symbol portions, the R1-R3 code symbol portions may also be unloaded to achieve the simultaneously unloading. Method 350 ends at block 364.

Figure 26:
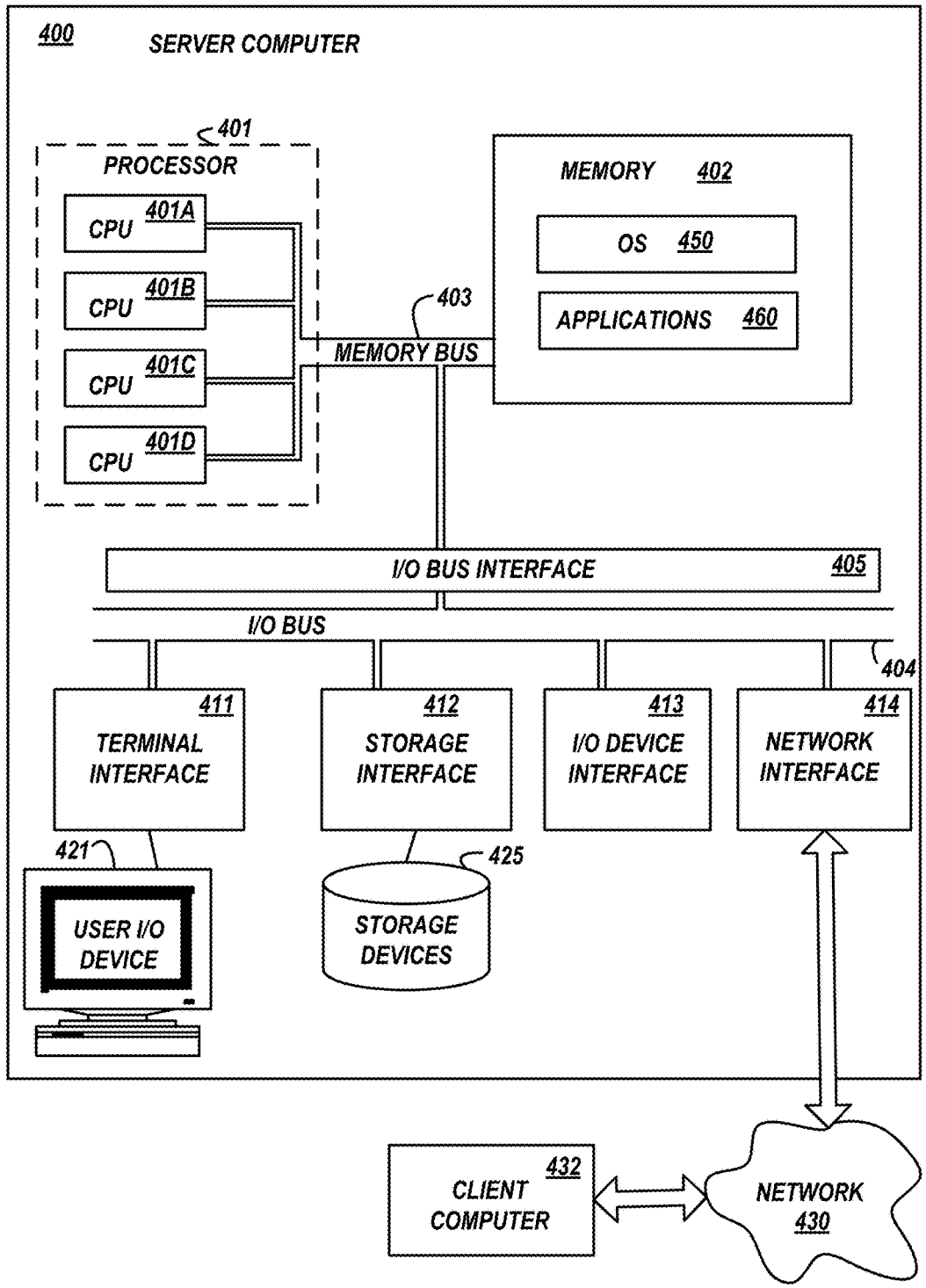
FIG. 26 depicts a schematic view of an exemplary data handling system that may include one or more embodiments of the present invention.

FIG. 26 depicts an exemplary data handling system in which embodiments of the present invention may be implemented. For example, FIG. 26 depicts a high-level block diagram representation of a server computer system 400 connected to a client computer system 432 via a network 130. The term "server" is used herein for convenience only, and in various embodiments a computer system that operates as a client computer in one environment may operate as a server computer in another environment, and vice versa. The mechanisms and apparatus of embodiments of the present invention apply equally to any appropriate computing system.

The computer system 400 may include one or more processors 401, a memory 402, a terminal interface 411, a storage interface 412, an I/O (Input/Output) device interface 413, a network adapter 414, and/or a diagonal anti-diagonal array 100 all of which are communicatively coupled, directly or indirectly, for inter-component communication via a memory bus 403, an I/O bus 104, and an I/O bus interface unit 105. In embodiments, the diagonal anti-diagonal array 100 and associated functions or components may be architecturally located e.g., within memory 402, within storage interface 412, within storage device 425, etc. or distributed across different locations. For example, memory 402 may be the buffer from which code symbol portions are stored and the array 100 and shift registers may be embodied within a FPGA storage device 425, etc.

The computer system 400 may contain one or more general-purpose programmable central processing units (CPUs) 401A, 401B, 401C, and 401D, herein generically referred to as the processor 401. In an embodiment, the computer system 400 contains multiple processors typical of a relatively large system; however, in another embodiment the computer system 400 may alternatively be a single CPU system. Each processor 401 may execute instructions stored in the memory 402 and may comprise one or more levels of on-board cache.

In an embodiment, the memory 402 may comprise a random-access semiconductor memory, storage device, or storage medium for storing or encoding data and programs. In another embodiment, the memory 402 represents the entire virtual memory of the computer system 400, and may also include the virtual memory of other computer systems coupled to the computer system 400 or connected via the network 430. The memory 402 is conceptually a single monolithic entity, but in other embodiments the memory 402 is a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures. In other embodiments, memory 402 may be an FPGA, ASIC or other custom integrated circuit, etc. which further includes array 100 may be a storage device that may store wide, very wide, etc. code symbols within the multidimensional array. In still other embodiments, storage array 100 is included in storage device 425 that may be accessed by processor 401 via, e.g. storage interface 412 and/or included in a storage system (i.e. client 432, etc.) that may be accessed by computer system 400 via, e.g. network 130, etc.

In certain embodiments, storage array 100 includes an array manager that manages unloading, loading, and accessing of data to or from storage array 100. The array manager may be a physical hardware component (e.g. semiconductor devices, chips, logical gates, circuits, etc.) of the FPGA, ASIC, or custom IC and/or a management routine that is executed by the FPGA, ASIC, custom IC, processor 401, etc. to carry out the functions as further herein. In certain embodiments, storage array 100 includes one or more input shift registers and/or one or more output shift registers to carry out the array 100 loading and unloading positioning as described herein. Though the input shift register and output shift register may be distinct entities, in some implementations, they may be a single entity. Further, in certain embodiments, storage array 100 may include one or more error correction code devices (e.g. decoder, encoder, etc.) or logic modules for performing error correction upon the data stored in the multidimensional array.

In certain embodiments, array manager, input shift register, output shift register, encoder, decoder, etc. may be distinct from storage array 100 and included in other devices in communication with storage array 100. For example, in certain embodiments array manager may be a distinct ASIC, FPGA, etc. in communication with storage array 100. In certain other embodiments, the functionality of array manager, input shift register, output shift register, etc. may be carried out by processor 401, etc.

The memory bus 403 provides a data communication path for transferring data among the processor 401, the memory 402, the storage array 416, and the I/O bus interface unit 405. The I/O bus interface unit 405 is further coupled to the system I/O bus 404 for transferring data to and from the various I/O units. The I/O bus interface unit 405 communicates with multiple I/O interface units 411, 412, 413, and 414, which are also known as I/O processors (IOPs) or I/O adapters (IOAs), through the system I/O bus 404.

The I/O interface units support communication with a variety of storage and I/O devices. For example, the terminal interface unit 411 supports the attachment of one or more user I/O devices 421, which may comprise user output devices (such as a video display device, speaker, and/or television set) and user input devices (such as a keyboard, mouse, keypad, touchpad, trackball, buttons, light pen, or other pointing device). A user may manipulate the user input devices using a user interface, in order to provide input data and commands to the user I/O device 421 and the computer system 400, and may receive output data via the user output devices. For example, a user interface may be presented via the user I/O device 421, such as displayed on a display device, played via a speaker, or printed via a printer.

The storage interface unit 412 supports the attachment of one or more disk drives or direct access storage devices 425 (e.g. rotating magnetic disk drive storage devices, arrays of disk drives configured to appear as a single large storage device to a host computer, Flash memory storage devices, etc.). In another embodiment, the storage device 425 may be implemented via any type of secondary storage device. The contents of the memory 402 and/or storage array 100, or any portion thereof, may be stored to and retrieved from the storage device 425, as needed. The I/O device interface 413 provides an interface to any of various other input/output devices or devices of other types, such as printers or fax machines. The network adapter 414 provides one or more communications paths from the computer system 400 to other digital devices and computer systems 432; such paths may comprise, e.g., one or more networks 430.

Although the memory bus 403 is shown in FIG. 26 as a relatively simple, single bus structure providing a direct communication path among the processors 401, the memory 402, and the I/O bus interface 405, in fact the memory bus 403 may comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 405 and the I/O bus 404 are shown as single respective units, the computer system 400 may, in fact, contain multiple I/O bus interface units 405 and/or multiple I/O buses 404. While multiple I/O interface units are shown, which separate the system I/O bus 404 from various communications paths running to the various I/O devices, in other embodiments some or all of the I/O devices are connected directly to one or more system I/O buses.

In various embodiments, the computer system 400 is a multi-user mainframe computer system, a single-user system, or a server computer or similar device that has little or no direct user interface, but receives requests from other computer systems (clients). In other embodiments, the computer system 400 is implemented as a desktop computer, portable computer, laptop or notebook computer, tablet computer, pocket computer, telephone, smart phone, pager, automobile, teleconferencing system, appliance, or any other appropriate type of electronic device.

The network 430 may be any suitable network or combination of networks and may support any appropriate protocol suitable for communication of data and/or code to/from the computer system 400 and the computer system 432. In various embodiments, the network 130 may represent a storage device or a combination of storage devices, either connected directly or indirectly to the computer system 400. In another embodiment, the network 430 may support wireless communications. In another embodiment, the network 430 may support hard-wired communications, such as a telephone line or cable. In another embodiment, the network 430 may be the Internet and may support IP (Internet Protocol). In another embodiment, the network 430 is implemented as a local area network (LAN) or a wide area network (WAN). In another embodiment, the network 430 is implemented as a hotspot service provider network. In another embodiment, the network 430 is implemented an intranet. In another embodiment, the network 430 is implemented as any appropriate cellular data network, cell-based radio network technology, or wireless network. In another embodiment, the network 430 is implemented as any suitable network or combination of networks (e.g. storage network, communication network, etc.). Although one network 430 is shown, in other embodiments any number of networks (of the same or different types) may be present. The client computer 432 may comprise some or all of the hardware and computer program elements of the server computer 400. The client computer 132 may also comprise additional elements not illustrated for the server computer 400.

FIG. 26 is intended to depict representative components of the server computer system 400, the network 430, and the client computer 432. But, individual components may have greater complexity than represented in FIG. 26, components other than or in addition to those shown in FIG. 26 may be present, and the number, type, and configuration of such components may vary. Several particular examples of such additional complexity or additional variations are disclosed herein; these are by way of example only and are not necessarily the only such variations. The various program components illustrated in FIG. 26 and implementing various embodiments of the invention may be implemented in a number of manners, including using various computer applications, routines, components, programs, objects, modules, data structures, etc., and are referred to hereinafter as "computer programs," or simply "programs."

In addition, various programs described hereinafter may be identified based upon the application for which they are implemented in a specific embodiment of the invention. But, any particular program nomenclature that follows is used merely for convenience, and thus embodiments of the invention are not limited to use solely in any specific application identified and/or implied by such nomenclature. The exemplary environments illustrated in FIG. 26 are not intended to limit the present invention. Indeed, other alternative hardware and/or program environments may be used without departing from the scope of embodiments of the invention.

Figure 27:
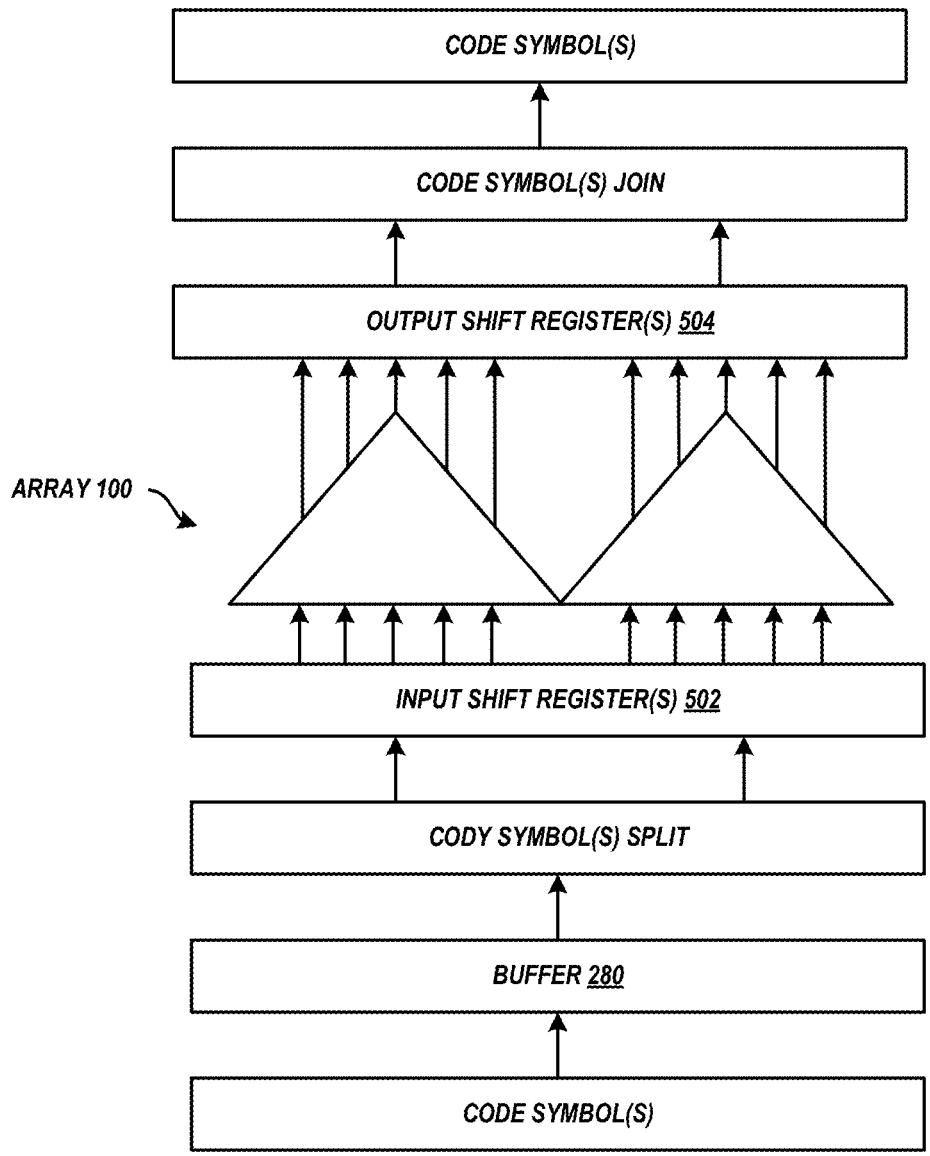
FIG. 27 depicts an exemplary storage diagonal anti-diagonal structure system, according to various embodiments of the present invention.

FIG. 27 depicts an exemplary storage structure 100 system 500, according to various embodiments of the present invention. Code symbols may be stored within buffer 280 and split into portions. For example, a code symbol may be split into a subarray 110A portion and a subarray 110B portion. The code symbol portions are loaded into one or more input shift registers 502 which may shift the code symbol portion for loading into the structure 100 such that the code symbol portions are mirrored diagonal/anti-diagonals with respect to the zero central bisector of each subarray. One or more output shift registers reverse the shift with respect to any input shifting such that the code symbol portions may be joined in the original order and provided to a requesting device.

In various embodiments of the present invention, a single data bit may be stored within an individual storage element. However, in other embodiments, multiple data bytes may be stored within an individual storage element. For example, a particular storage element may be able to store 8 bytes of data.

In certain embodiments, code symbols may be unloaded from storage structure 100 and fed to a requesting device in quantities of single R code symbols or C code symbols. For example, in high performance applications, R code symbol or C code symbol respectively is fed to the requesting device in its entirety during a single hardware clock cycle. In another example, in maximum performance applications, multiple rows or multiple columns in their entirety, respectively, may be fed to the requesting device simultaneously.

In certain embodiments, the buffer 280 is populated from a Flash memory device. For example, storage structure 100 may be loaded from the buffer 280 with data retrieved from a NAND flash storage device 425, a Solid State Drive (SSD) device 425, etc. In certain embodiments, data unloaded from structure 100 may be delivered to a requesting device, e.g. a decoder 126. For example, in a particular error correction scheme, each R code symbol of structure 100 may be fed to decoder 5 and each row is returned to the array with corrections. After the R code symbols are processed by decoder 5, each C code symbol may be processed similarly. Correction of all errors may require several iterations of R code symbol and C code symbol processing that are reduced by utilizing structure 100. In certain other embodiments, structure 100 may be populated by processor 401 and the requesting device may also be processor 401. In various embodiments, structure 100 may be comprised within a NAND flash storage device 425, comprised within a storage controller device that resides within NAND flash storage device 425, etc.

In certain embodiments, data entering structure 100 is shifted by input shifter 502 and data exiting structure 100 is shifted by output shifter 504. In certain embodiments, input shifter 502 may implement a circular shift, bitwise rotation, variable length serial shift, etc. In certain embodiments, the data entering structure 100 is shifted to expose each C code symbol such that an entire C code symbol is fed to the requesting device in a single hardware clock cycle. In certain embodiments, the data entering structure 100 is shifted such that an entire row may still be fed to the requesting device in a single hardware clock cycle. Still in certain embodiments, the data entering structure 100 is shifted such that an entire column or an entire row may be fed to the requesting device in a single hardware clock cycle. Data exiting structure 100 is shifted by output shifter 504 such that the lowest order bit(s) within the output code symbol is located in the lowest order position. In certain implementations, the output shifter 504 un-shifts a particular code symbol, code symbol portion, etc. to be organized as it was prior to being shifted by input shifter 502. In other words, output shifter 504 may reverse the shift performed by input shifter 502.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A diagonal anti-diagonal storage structure comprising:
    a diagonal storage subarray and an anti-diagonal storage subarray each comprising:
        a plurality of storage locations arranged in a plurality of adjacent stacks; and
        a plurality of mirrored storage locations that are reflections of the storage locations against a central subarray bisector; and
    a plurality of partitions each comprising:
        a diagonal storage subarray partition structure comprising a group of storage locations diagonally aligned with respect to the central array bisector of the diagonal storage subarray and a group of mirrored storage locations orthogonally aligned with respect to the center array bisector of the diagonal storage subarray; and
        an anti-diagonal storage subarray partition structure comprising a group of storage locations anti-diagonally aligned with respect to the central array bisector of the anti-diagonal storage subarray and a group of mirrored storage locations orthogonally aligned with respect to the center array bisector of the anti-diagonal storage subarray.

2. The diagonal anti-diagonal storage structure of claim 1, wherein a first code symbol is unloaded from the diagonal anti-diagonal storage structure in a single clock cycle by unloading a first portion of the first code symbol from a first diagonal storage subarray partition structure and unloading a second portion of the first code symbol from a first anti-diagonal storage subarray partition structure.

3. The diagonal anti-diagonal storage structure of claim 1, wherein multiple code symbols are unloaded from the diagonal anti-diagonal storage structure in a single clock cycle by unloading a first code symbol from a first partition and unloading a second code symbol from a second partition in a same clock cycle.

4. The diagonal anti-diagonal storage structure of claim 1, further comprising:
    an input buffer that temporality stores a code symbol prior to loading the code symbol within the diagonal anti-diagonal storage structure.

5. The diagonal anti-diagonal storage structure of claim 1, wherein a plurality of code symbols are symmetrically reflected with respect to the central subarray bisector.

6. The diagonal anti-diagonal storage structure of claim 1, wherein the central subarray bisector is a vertical stack of storage locations each respectively loaded with zeros.

7. The diagonal anti-diagonal storage structure of claim 1, wherein a first code symbol is unloaded from the diagonal anti-diagonal storage structure by concatenating a first portion of the first code symbol from the diagonal storage subarray with a second portion of the first code symbol from the anti-diagonal storage subarray.

8. The diagonal anti-diagonal storage structure of claim 1, further comprising:
    an output buffer that temporality stores a code symbol subsequent to unloading the code symbol from the diagonal anti-diagonal storage structure.

9. A diagonal anti-diagonal storage structure access method comprising:
    unloading a first code symbol, comprising a first plurality of symbols, from a first partition of the diagonal anti-diagonal storage structure at a particular clock cycle, the first partition comprising a first portion of the first partition within a diagonal storage subarray and a second portion of the first partition within an anti-diagonal storage subarray; and
    simultaneously unloading a second code symbol, comprising a second plurality of symbols, from a second partition of the diagonal anti-diagonal storage structure at the particular clock cycle, the second partition comprising a first portion of the second partition within the diagonal storage subarray and a second portion of the second partition within the anti-diagonal storage subarray.

10. The method of claim 9, wherein both the diagonal storage subarray and the anti-diagonal storage subarray further comprise:

a plurality of storage locations that store a symbol and are arranged in a plurality of vertical stacks;

a plurality of mirrored storage locations that store a mirror of the symbol against a central subarray bisector.

11. The method of claim 9, wherein the first portion of the first partition comprises a horizontal portion on one side of the central subarray bisector of the diagonal storage subarray and a diagonal portion on an opposite side of the central subarray bisector of the diagonal storage subarray.

12. The method of claim 9, wherein the first portion of the second partition comprises a horizontal portion on one side of the central subarray bisector of the anti-diagonal storage subarray and an anti-diagonal portion on an opposite side of the central subarray bisector of the anti-diagonal storage subarray.

13. The method of claim 9, wherein the first code symbol is unloaded from the diagonal anti-diagonal storage structure by concatenating an unloaded first portion of the first code symbol from the diagonal storage subarray with an unloaded second portion of the first code symbol from the anti-diagonal storage subarray.

14. A computer program product for accessing a diagonal anti-diagonal storage structure, the computer program product comprising a computer readable storage medium having program code embodied therewith, the program code executable to:

unload a first code symbol, comprising a first plurality of symbols, from a first partition of the diagonal anti-diagonal storage structure at a particular clock cycle, the first partition comprising a first portion of the first partition within a diagonal storage subarray and a second portion of the first partition within an anti-diagonal storage subarray; and simultaneously unload a second code symbol, comprising a second plurality of symbols, from a second partition of the diagonal anti-diagonal storage structure at the particular clock cycle, the second partition comprising a first portion of the second partition within the diagonal storage subarray and a second portion of the second partition within the anti-diagonal storage subarray.

15. The computer program product of claim 14, wherein both the diagonal storage subarray and the anti-diagonal storage subarray further comprise:

a plurality of storage locations that store a symbol and are arranged in a plurality of vertical stacks;

a plurality of mirrored storage locations that store a mirror of the symbol against a central subarray bisector.

16. The computer program product of claim 14, wherein the first portion of the first partition comprises a horizontal portion on one side of the central subarray bisector of the diagonal storage subarray and a diagonal portion on an opposite side of the central subarray bisector of the diagonal storage subarray.

17. The computer program product of claim 14, wherein the first portion of the second partition comprises a horizontal portion on one side of the central subarray bisector of the anti-diagonal storage subarray and an anti-diagonal portion on an opposite side of the central subarray bisector of the anti-diagonal storage subarray.

18. The computer program product of claim 14, wherein the first code symbol is unloaded from the diagonal anti-diagonal storage structure by concatenating an unloaded first portion of the first code symbol from the diagonal storage subarray with an unloaded second portion of the first code symbol from the anti-diagonal storage subarray.

* * * * *